United States Patent [19]

Tamamura et al.

[11] Patent Number: 5,666,387

[45] Date of Patent: Sep. 9, 1997

[54] SIGNAL PROCESSING DEVICE HAVING PLL CIRCUITS

[75] Inventors: Masaya Tamamura; Shinichi Shiotsu, both of Kawasaki, Japan

[73] Assignee: Fujitsu Limited, Kawasaki, Japan

[21] Appl. No.: 297,835

[22] Filed: Aug. 30, 1994

[30] Foreign Application Priority Data

Dec. 24, 1993 [JP] Japan ................. 5-328881

[51] Int. Cl.⁶ .................. H03D 3/24; H03L 7/00
[52] U.S. Cl. ................. 375/371; 331/25
[58] Field of Search ................. 375/119, 118, 375/120, 371, 375, 376, 373; 331/1 A, 14, 34, 25

[56] References Cited

U.S. PATENT DOCUMENTS

| | | | |
|---|---|---|---|
| 4,336,508 | 6/1982 | Cole et al. | 331/34 |
| 4,496,977 | 1/1985 | Ikeda | 358/148 |
| 4,633,193 | 12/1986 | Scordo | 331/1 A |
| 5,072,195 | 12/1991 | Graham et al. | 331/1 A |
| 5,319,680 | 6/1994 | Port et al. | 375/120 |

FOREIGN PATENT DOCUMENTS

| | | |
|---|---|---|
| 0 450 445 A2 | 10/1991 | European Pat. Off. . |
| 0 458 282 A2 | 11/1991 | European Pat. Off. . |

OTHER PUBLICATIONS

European Search Report dated May 18, 1995.

*Primary Examiner*—Curtis Kuntz
*Assistant Examiner*—Paul Loomis
*Attorney, Agent, or Firm*—Armstrong, Westerman, Hattori, McLeland & Naughton

[57] ABSTRACT

A signal processing device includes a first PLL circuit operating in synchronism with a serial input data signal, and a second PLL circuit operating in synchronism with an external reference clock signal. The oscillation frequency of the first PLL circuit is controlled by the second PLL circuit.

29 Claims, 29 Drawing Sheets

SIGNAL PROCESSING DEVICE HAVING PLL CIRCUITS

BACKGROUND OF THE INVENTION

1. Field of the Invention

The present invention generally relates to PLL (Phase-Locked Loop) circuits, and more particularly to a PLL circuit which generates a clock signal synchronized with data signal serially transferred and signal processing such as a PLL circuit.

Generally, data is serially transmitted over a single transmission line. In order to receive a data signal serially transmitted, it is necessary to generate a clock signal which is synchronized with the data signal, more specifically, which has a frequency and phase coinciding with those of the received data signal.

2. Description of the Prior Art

FIG. 1 is a block diagram of a configuration which generates a clock signal from a serial data signal serially transmitted and synchronized with the received serial data signal. A frequency extracting unit 10 extracts a frequency component of the clock signal from a serial input data signal Ds in which data "0" and "1" occur irregularly. A SAW (Surface Acoustic Wave) filter 12 filters the frequency component of the clock signal, and generates therefrom the clock signal synchronized with the input data signal Ds.

FIG. 2 is a block diagram of another configuration using a PLL circuit. Generally, the PLL circuit is capable of generating a clock signal from a certain clock signal, the former clock signal being synchronized with the latter clock signal and having a frequency equal to that of the latter clock signal or an integer multiple of the frequency of the latter clock signal. Recently, there has been considerable activity in applications of the configuration shown in FIG. 2 rather than the configuration shown in FIG. 1. The configuration shown in FIG. 2 is an application of the PLL circuit directed to generate the clock signal from the serial input data signal. The PLL circuit shown in FIG. 2 includes a phase comparator 20, a loop filter 30, a voltage controlled oscillator (VCO) 40 and a frequency divider 50. The phase comparator 20 compares the phase of the serial input data signal Ds with that of a clock signal CLK, and outputs a signal dependent on the phase difference. The loop filter 30 integrates the signal indicating the phase difference, and generates a control voltage Vc therefrom. The control voltage Vc is output to the VCO 40, which oscillates at a frequency Vc defined by the control voltage Vc. The frequency divider 50 divides the oscillation frequency and thereby outputs the clock signal CLK.

As shown in FIG. 2, the phase comparator 20 is made up of a delay circuit D, an OR circuit (gate) OR1, and NOR circuits (gates) NOR1 and NOR2.

FIG. 3 is a timing chart of the operation of the PLL circuit shown in FIG. 2. In FIG. 3, symbols N1 through N6 respectively denote signals at nodes N1 through N6 shown in FIG. 2. Further, the expressions shown in the parentheses indicate the logical expressions showing the corresponding gate circuits. For example, the phrase "N3 (=N1+/N2: where symbol "/" denotes bar indicative of the inverted version of the signal (N2 in this example))" denotes the output signal of the OR gate OR1, and means the result of the OR operation on the signal N1 (input data signal Ds) and the inverted version of the signal N2 delayed by the delay circuit D.

The OR circuit OR1 defines, each falling edge of the input data signal Ds, a compare window (the period during which the signal N3 is low) used to compare the phase of the clock signal CLK and the phase of the input data signal Ds. The NOR circuits NOR1 and NOR2 perform the NOR operation on the compare window signal (low level) N3 and the clock signal CLK, and respectively generate an $f_{up}$ signal (leading pulse signal) N5 and an $f_{down}$ signal (a lagging pulse signal) N6. These signals N5 and N6 are applied to corresponding terminals of the loop filter 30, which separately integrates the $f_{up}$ signal N5 and the $f_{down}$ signal N6, and outputs the result of the above integration to the VCO 40. When the value of the integration of the $f_{up}$ signal N5 is greater than that of the integration of the $f_{down}$ signal N6, the loop filter 40 outputs the control voltage Vc which increases the oscillation frequency of the VCO 40. When the value of the integration of the $f_{up}$ signal N5 is less than that of the integration of the $f_{down}$ signal N6, the loop filter 40 outputs the control voltage Vc which decreases the oscillation frequency of the VCO 40.

In the case shown in FIG. 3, the sum of the pulse widths of the $f_{up}$ signal N5 in cycles P1 through P6 is greater than that of the pulse widths of the $f_{down}$ signal N6 in the same cycles as mentioned above. Hence, the loop filter 30 generates the control voltage Vc which functions to increase the oscillation frequency of the VCO 40. Hence, the oscillation frequency becomes higher and the PLL circuit is operationally locked when the sum of the pulse widths of the $f_{up}$ signal N5 becomes equal to that of the pulse widths of the $f_{down}$ signal N6. That is, the PLL circuit is locked when the phase of the rising edge of the clock signal CLK coincides with the center of the compare window N3.

In general, the frequency component of the clock signal generated from the input data signal Ds is twice the frequency (data transmission rate) of the data signal. Even in the example shown in FIG. 3, the frequency of the clock signal CLK is set to be twice the frequency of the data signal. With the above setting of the frequency of the clock signal CLK, it is possible to ensure that the rising edge of the clock signal CLK is present within the compare window N3 without exception.

However, the PLL circuit shown in FIG. 2 has the following disadvantages.

First, the PLL circuit is suitable for applications in which a clock signal is processed as an input signal in which binary values "0" and "1" repeatedly appear regularly. However, the PLL circuit is not suitable for a data signal in which binary values "0" and "1" appear irregularly. More particularly, in the example shown in FIG. 3, the phase comparison is performed in the cycles P1, P3 and P6. The nature of the data signal allows the input data signal Ds to be fixed to "0" or "1" for a long time. During this time, the compare window N3 cannot be generated and the phase comparing operation cannot be executed. As a result, it is impossible to control the VCO 40 during the above time period and compensate for variations in the environment such as variations in the temperature and the power supply voltage. When the next data is received, there may be large deviations in the oscillation frequency and phase of the clock signal, and it will take a long time for the PLL circuit to be operationally locked. It is thus concluded that the PLL circuit shown in FIG. 2 is applicable only to a limited communication in which data is not frequently interrupted.

Second, as has been described previously, the clock signal CLK for use in phase comparison is needed to have a frequency equal to twice the frequency of the data signal. Recently, there has been considerable activity in improving data transmission rate in order to transmit a large amount of data at high speeds. As the transmission rate becomes higher, the frequency of the clock signal equal to twice the transmission rate becomes higher. However, as the frequency of the clock signal becomes higher, a larger amount of energy is consumed, and the crosstalk becomes larger when transferring signals on a printed circuit board. From the above viewpoints, it is desirable to provide a PLL circuit capable of performing the phase comparing operation using a clock signal having a frequency equal to that of the data signal. However, as will be described in detail below, a problem will occur in which it is no longer ensured that the rising edge of the clock signal CLK is present within the compare window N3 without exception. The above problem will be described below in conjunction with FIG. 4.

FIG. 4 is a timing chart of an operation in which the frequency of the clock signal CLK (N4) is set equal to that of the input data signal Ds. In the cycles P1 and P3, the pulse width of the $f_{up}$ signal is greater than that of the $f_{down}$ signal, and thus the VCO 40 is operated so that its oscillation frequency becomes high. However, in the cycle P6, the pulse width of the $f_{down}$ signal N6 is greater than that of the $f_{up}$ signal N5, and thus the VCO 40 is reversely operated so that its oscillation frequency becomes low. In other words, when the falling edge of the clock signal CLK is present within the compare window N3, the reverse relationship between the $f_{up}$ signal N5 and the $f_{down}$ signal N6 occurs, and the loop filter 30 is notified of the above reverse relationship. Hence, it is impossible to lock the PLL circuit in synchronism with the phase of the input data signal Ds.

SUMMARY OF THE INVENTION

It is a general object of the present invention to provide a signal processing device having a PLL circuit in which the above disadvantages are eliminated.

A more specific object of the present invention is to provide a signal processing device having a PLL circuit capable of stably and precisely generating a clock signal synchronized with a serial data signal with a low power consumption.

The above objects of the present invention are achieved by a signal processing device comprising:

a first PLL circuit operating in synchronism with a serial input data signal; and a second PLL circuit operating in synchronism with an external reference clock signal, an oscillation frequency of the first PLL circuit being controlled by the second PLL circuit.

The above objects of the present invention are also achieved by a signal processing device comprising:

phase comparing means for comparing a phase of a serial input data signal with a phase of a clock signal and generating a leading pulse signal and a lagging pulse signal dependent on a phase difference indicated by a result of a phase comparison;

loop filter means for integrating the leading pulse signal and the lagging pulse signal and for generating a control signal; and oscillator means for generating the clock signal which has a frequency identical to that of the serial input data signal and is varied in accordance with the control signal, and wherein the phase comparing means comprises:

first gate means for generating a phase compare window signal for each rising or falling edge of the serial input data signal;

second gate means for generating the leading pulse signal and the lagging pulse signal on the basis of the phase compare window signal and the clock signal; and detection/selection means for detecting an edge of the clock signal within phase compare window indicated by the phase compare window signal, outputting the leading pulse signal and the lagging pulse signal to the loop filter means without any modification when a predetermined first one of the rising edge and falling edge of the clock signal is detected, and for outputting the leading pulse signal and the lagging pulse signal, as a lagging pulse signal and a leading pulse signal, to the loop filter means when a predetermined second one of the rising edge and falling edge of the clock signal is detected.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 5:
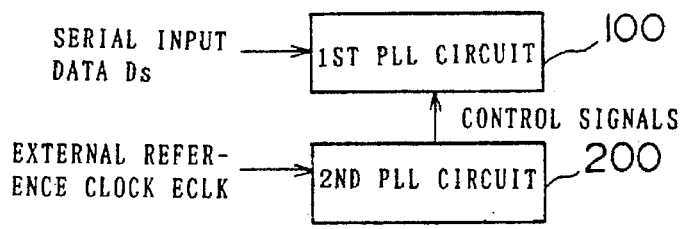
FIG. 5 is a block diagram of the principle of the present invention.

The principle of the present invention will now be described with reference to FIG. 5.

A signal processing device using a PLL according to the present invention includes two PLL circuits consisting of a first PLL circuit 100 and a second PLL circuit 200. The first PLL circuit 100 receives the serial input data signal Ds, and operates in synchronism with the signal Ds. The second PLL circuit 200 receives an external reference clock signal ECLK, and operates in synchronism with the signal ECLK. The external reference clock signal ECLK can have a frequency greatly lower than the frequency of the input data signal Ds. The second PLL circuit 200 is locked in a state in which the second PLL circuit 200 is synchronized with the external reference clock signal ECLK. A control signal within the second PLL circuit 200 obtained at the above time (more particularly, a signal applied to an oscillator built in the second PLL circuit 200) is applied to the first PLL circuit 100 (more particularly, an oscillator built in the first PLL circuit 100), so that the oscillation frequency is controlled by the above signal as well as the input data signal Ds.

The oscillation frequency of the first PLL circuit 100 is controlled based on whether the falling edge or the rising edge of the clock signal for use in phase comparison appears within a compare window generated from the input data signal Ds within the first PLL circuit 100.

The second PLL circuit 200 operates in synchronism with the external reference clock signal ECLK having a regularity, and is hence capable of stably operating without any influence from the peripheral environment. The control signal obtained in the above state and used to control the oscillation frequency of the second PLL circuit 200 is applied to the first PLL circuit 100 as a signal for controlling the oscillation frequency in the first PLL circuit 100. Hence, the oscillation frequency of the first PLL circuit 100 is substantially determined by the control signal from the second PLL circuit 200 first, and is determined by the phase comparison with the input data signal Ds second.

It will now be assumed that the transmission bit rate of the input data signal Ds is M (bps) and the oscillation frequencies of the first PLL circuit 100 and the second PLL circuit 200 are M (Hz). Hence, even if the input data signal Ds is not received, the first PLL circuit 100 stably operates at the oscillation frequency determined by the second PLL circuit, that is, M (Hz). When data is received in the above state, the first PLL circuit 100 controls the oscillation frequency and the phase so as to oscillate in synchronism with the input data signal Ds. In the ideal state, the oscillation frequency is already equal to the data transmission bit rate. Hence, only the phase is controlled. In the above case, the frequency of the external reference clock signal ECLK may be equal to M/N where N is an integer.

Further, the aforementioned second problem can be overcome because the oscillation frequency of the first PLL circuit 100 is controlled on the basis of whether the rising edge or the falling edge of the clock signal for use in phase comparison appears within the compare window generated from the input data signal Ds within the first PLL circuit 100.

A description will now be given of preferred embodiments of the present invention.

Figure 6:
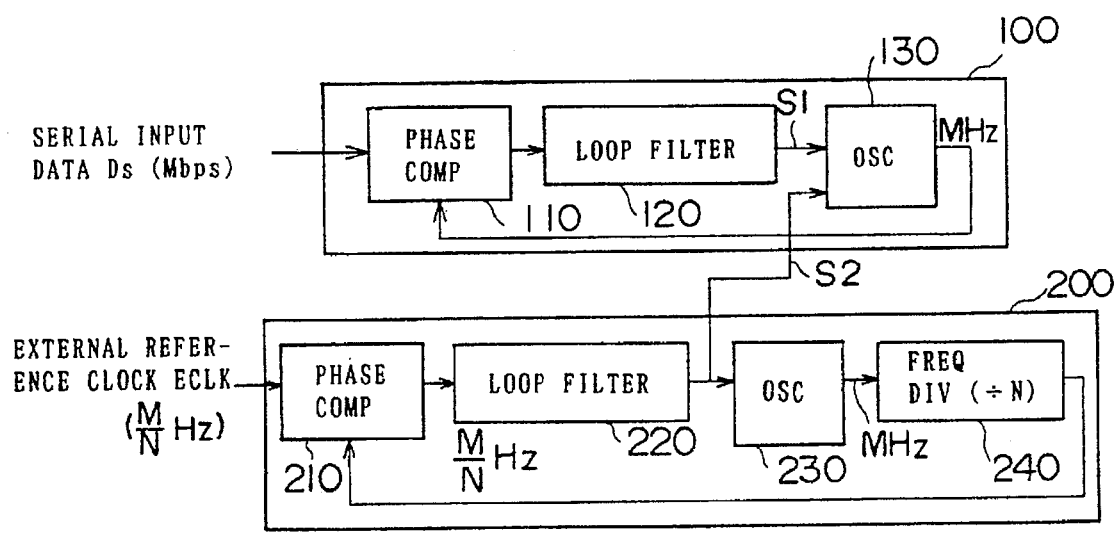
FIG. 6 is a block diagram of a first embodiment of the present invention.

FIG. 6 is a block diagram of a first embodiment of the present invention. The first PLL circuit 100 shown in FIG. 5 has a phase comparator 110, a loop filter 120 and an oscillator 130. The second PLL circuit 200 has a phase comparator 210, a loop filter 220, an oscillator 230 and a frequency divider 240. When the serial input signal Ds has a transmission bit rate M (bps), the second PLL circuit 200 is operated in synchronism with the external reference clock signal ECLK so that the oscillator 230 built in the second PLL circuit 200 oscillates at a frequency M (Hz). The phase comparator 210 located in the loop compares the phase of a signal having a frequency M/N (Hz) obtained by dividing the oscillation frequency M (Hz) output by the oscillator 230 by N (N is an integer) with the phase of the external reference clock signal ECLK having a frequency M/N (Hz). Hence, the oscillator 230 can stably oscillate at frequency M in phase with the external reference clock signal without influence of the peripheral environment.

A control signal S2 output by the loop filter 220 at the above time is applied to the oscillator 130 of the first PLL circuit 130. It is preferable that the oscillator 230 has a structural arrangement (circuit configuration) identical to that of the oscillator 130. Hence, the oscillator 130 of the first PLL circuit 100 which receives the same control signal S2 oscillates at a frequency approximately equal to M (Hz). In this state, the oscillation frequency of the oscillator 130 may not be exactly the same as the frequency of the serial input data signal Ds. The phase comparator 110 in the loop compares the phase of the output signal (clock signal) of the oscillator 130 with the phase of the input data signal Ds, and controls, through the loop filter 120, the oscillator 130 so that the phase and frequency of the clock signal generated by the oscillator 130 coincide with those of the input data signal Ds. At this time, the signal output by the loop filter 120 is applied to the oscillator 130 as a control signal S1.

In the above manner, the oscillator 130 in the first PLL circuit 100 outputs the oscillation frequency approximately equal to the frequency of the input data signal Ds in accordance with the control signal S2 output by the second PLL circuit 200, and outputs the oscillation signal having the same frequency and phase as those of the input data signal Ds by the phase comparing operation. Hence, even if the input data signal Ds is not received, the oscillator 130 stably oscillates continuously at the frequency M (Hz), and the oscillation frequency can be pulled in synchronization with the data signal Ds received later.

In practice, it is preferable that the oscillator 130 of the first PLL circuit 100 and the oscillator 230 of the second PLL circuit 200 be formed on a single chip. With such structural arrangement, the oscillators 130 and 230 have the same performance, and oscillate at the same frequency in response to the same control signal S2.

In the structural arrangement shown in FIG. 6, the oscillator 130 oscillates at the frequency M (Hz) equal to the data transmission rate M (bps). It is possible for the oscillator 130 to oscillate at a frequency higher than the frequency M (Hz). In this case, the oscillation frequency of the oscillator 130 is divided by a frequency divider to thereby produce the clock signal having the frequency M (Hz). In this structural arrangement, it is necessary that the oscillator 230 in the second PLL circuit 200 oscillates at the same frequency as that of the oscillator 130 in the first PLL circuit 100.

In the above description, the clock frequency compared in phase with the input data signal Ds by means of the phase comparator 110 is equal to the frequency (M) of the input data signal Ds. Alternatively, the clock frequency may be higher than (for example, 2×M (Hz)) or lower than (for example, M/2 (Hz)). In the first embodiment of the present invention, the oscillation frequency in the first PLL circuit 100 is substantially determined by the second PLL circuit 200. Hence, the phase comparison can be carried out with a sufficient precision even when using the lock signal having a frequency lower than the frequency of the input data signal.

Further, it is preferable that the loop gain of the second PLL circuit 200 be greater than that of the first PLL circuit 100. This is because the second PLL circuit 200 provides a wide variable frequency range to compensate for variations in the temperature and the power supply voltage. The first PLL circuit 100 carries out the fine adjustment of the frequency approximately equal to that of the input data signal Ds. Hence, the first PLL circuit 100 does not need a loop gain as large as the second PLL circuit 200.

The oscillator 130 is controlled by the two control signals S1 and S2, and the oscillator 230 is controlled by the single control signal S2. When the oscillators 130 and 230 have the same circuit configuration, a fixed signal is applied to the terminal of the oscillator 230 receiving the signal corresponding to the control signal S2.

Figure 7:
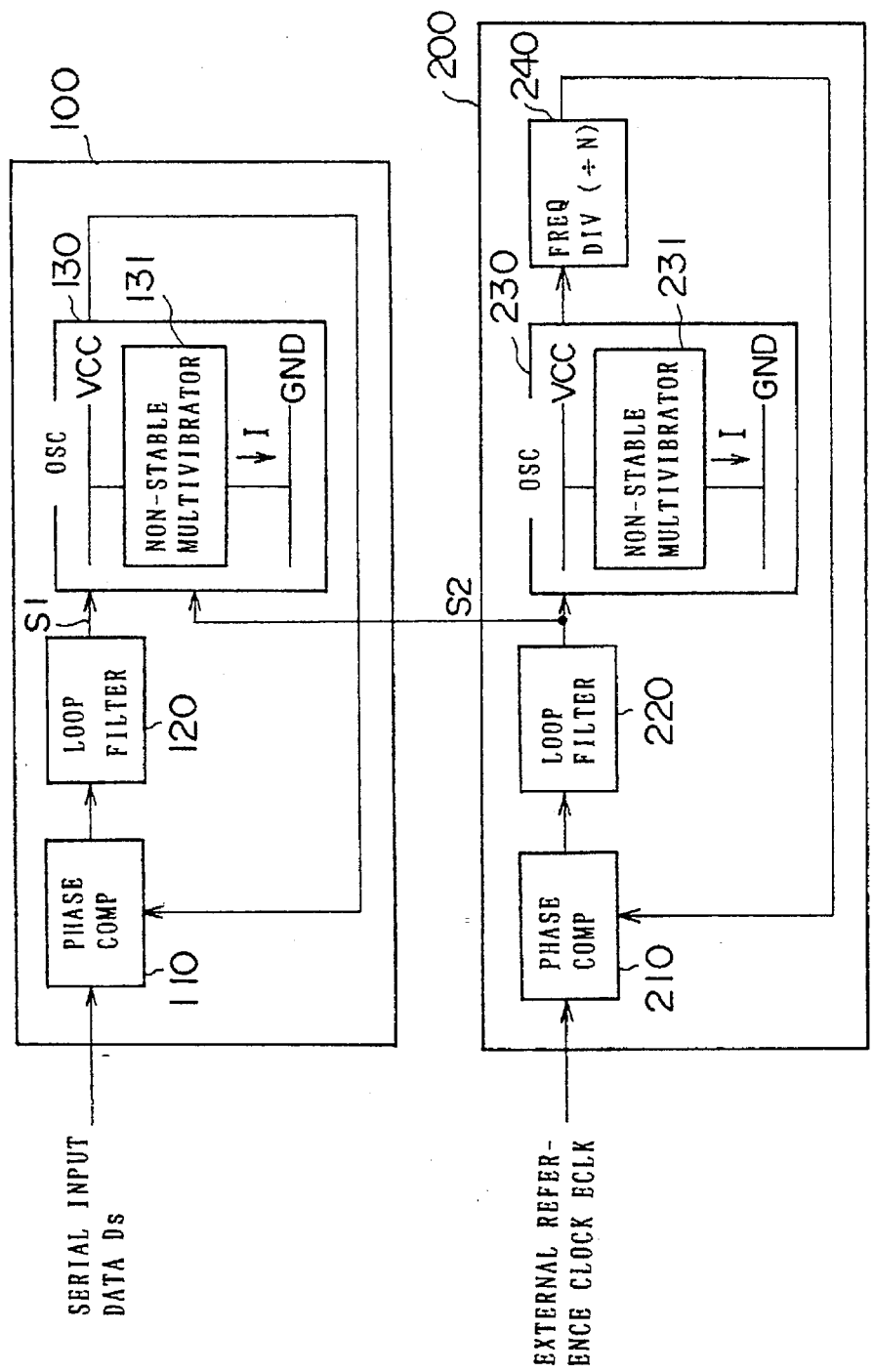
FIG. 7 is a block diagram of a second embodiment of the present invention.

FIG. 7 is a block diagram of a signal processing device in which the oscillators 130 and 230 are formed with non-stable multivibrators 131 and 231, respectively. A description will now be given of a second embodiment of the present invention corresponding to the signal processing device in which the oscillators 130 and 230 are formed with non-stable multivibrators 131 and 231, respectively. In general, the non-stable multivibrator changes its oscillation frequency by changing a parameter, such as a current flowing therein, a capacitance present therein or a voltage (amplitude) developing across a capacitance. For example, the control signal S2 outputted by the loop filter 220 controls current I flowing in the non-stable multivibrators 131 and 231. The signal S1 outputted by the loop filter 120 controls another current flowing in the non-stable multivibrator 131, a capacitance present therein or the voltage developing across a capacitance. In this case, parameters not used to control the oscillation frequency are set to constant values.

Figure 8:
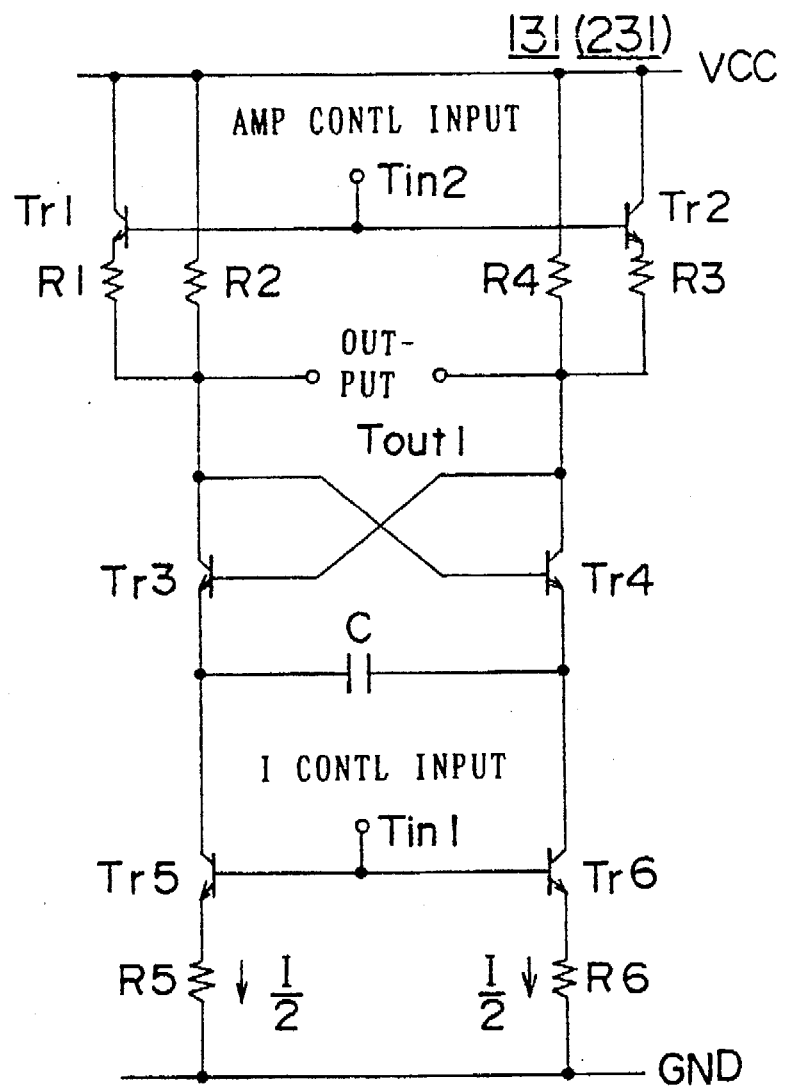
FIG. 8 is a circuit diagram of a non-stable multivibrator shown in FIG. 7.

FIG. 8 is a circuit diagram of the circuit configuration of each of the non-stable multivibrators 131 and 231. The circuit configuration shown in FIG. 8 includes transistors Tr1 through Tr6, a capacitor C, resistors R1 through R6, control terminals Tin1 and Tin2, and an output terminal Tout1. A case will now be considered where predetermined voltages are applied to the control terminals Tin1 and Tin2 and hence the transistors Tr1, Tr2, Tr5 and Tr6 are ON. When the transistor Tr3 is ON, the current flowing in the resistors R1 and R2 from a power supply line VCC flows to a ground line GND, on one side, via the transistor Tr3, and on the other side, via the capacitor C and the transistor Tr6. When the capacitor C is charged up, the transistor Tr3 is turned ON, and hence its collector potential is increased. In response to the increase in the collector potential, the transistor Tr4 is turned ON, and a current starts to flow to the transistor Tr4 from the power supply line VCC via the resistors R3 and R4. This current flows in the transistor Tr6, and flows in the capacitor C and the transistor Tr5. Hence, the capacitor C is discharged and is thereafter charged in the reverse direction. When the capacitor C is charged in the above manner, the transistor Tr4 is turned OFF, and its collector potential is increased. The above operation is repeatedly carried out, and an oscillation signal dependent on charging and discharging with respect to the capacitor C is output via the output terminal Tout1.

By varying the control voltage applied to the control terminal Tin1, it is possible to control currents I/2 respectively flowing in the transistors Tr5 and Tr6 and hence control the oscillation frequency. By varying the control voltage applied to the control terminal Tin2, it is possible to control the amounts of currents respectively flowing in the current paths having the transistors Tr1 and Tr2. Hence, by varying the magnitudes of the voltage drops across the resistors R1 and R2, it is possible to control the voltage developing across the capacitor C. The oscillation frequency can be determined by the control signal applied to the control terminal Tin1 even when the control voltage applied to the control terminal Tin2 is set to 0 V and hence the transistors Tr1 and Tr2 are turned OFF, because currents flow in the current paths respectively including the resistors R2 and R4.

Figure 9:
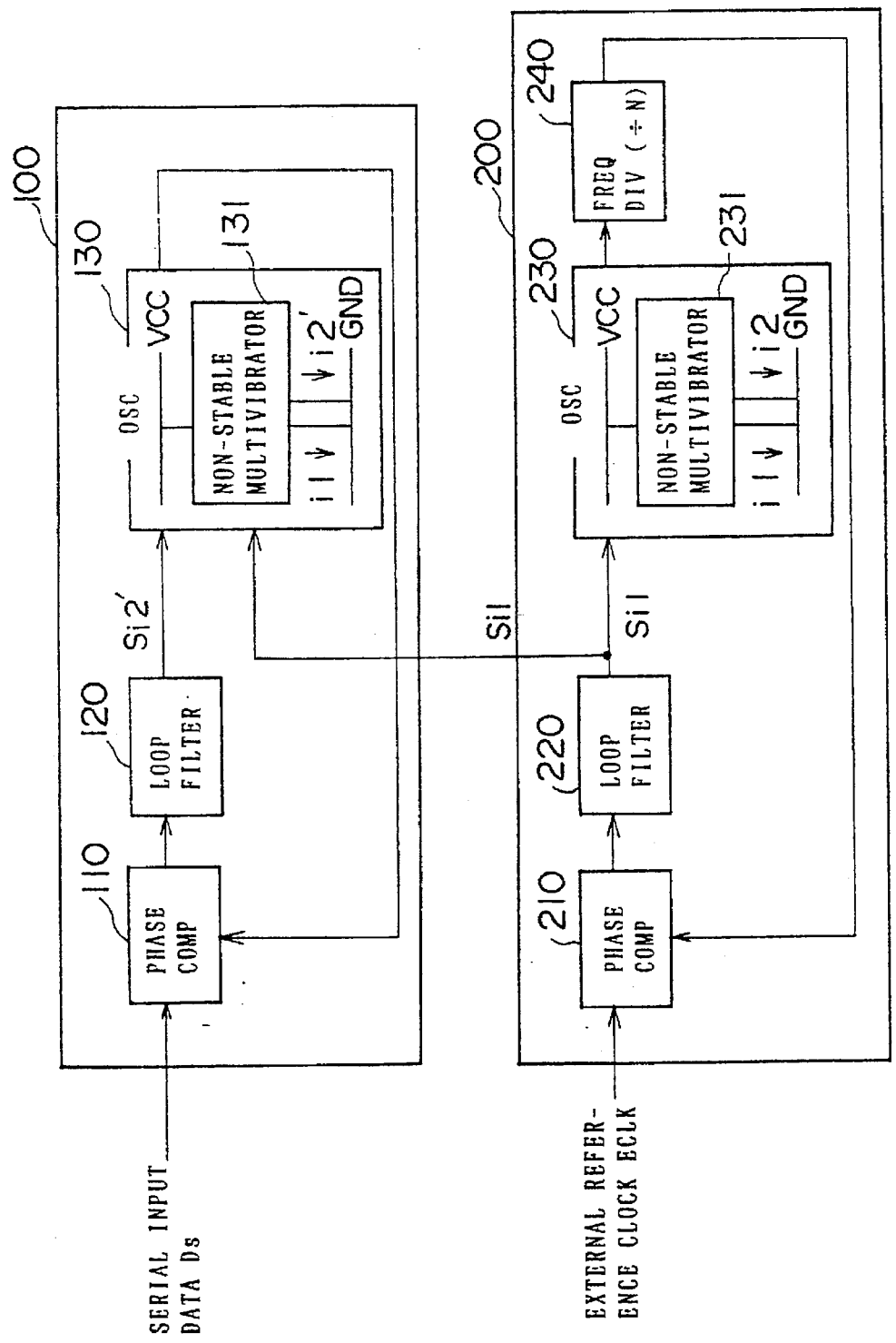
FIG. 9 is a block diagram of a first version of the second embodiment of the present invention.

FIG. 9 shows a first version of the configuration shown in FIG. 7, in which current i1, which is one of the two currents i1 and i2 flowing in the non-stable multivibrator 231, is controlled by the control signal S2 (in FIG. 9, the control signal S2 is particularly expressed as Si1). Further, the current i1 flowing in the non-stable multivibrator 131 is controlled by the same control signal Si1 from the loop filter 220. The other current i2' flowing in the non-stable multivibrator 131 is controlled by the control signal S1 (in FIG. 9, the control signal S1 is particularly expressed as Si2'). The other current i2 flowing in the non-stable multivibrator 231 is fixed.

Figure 10:
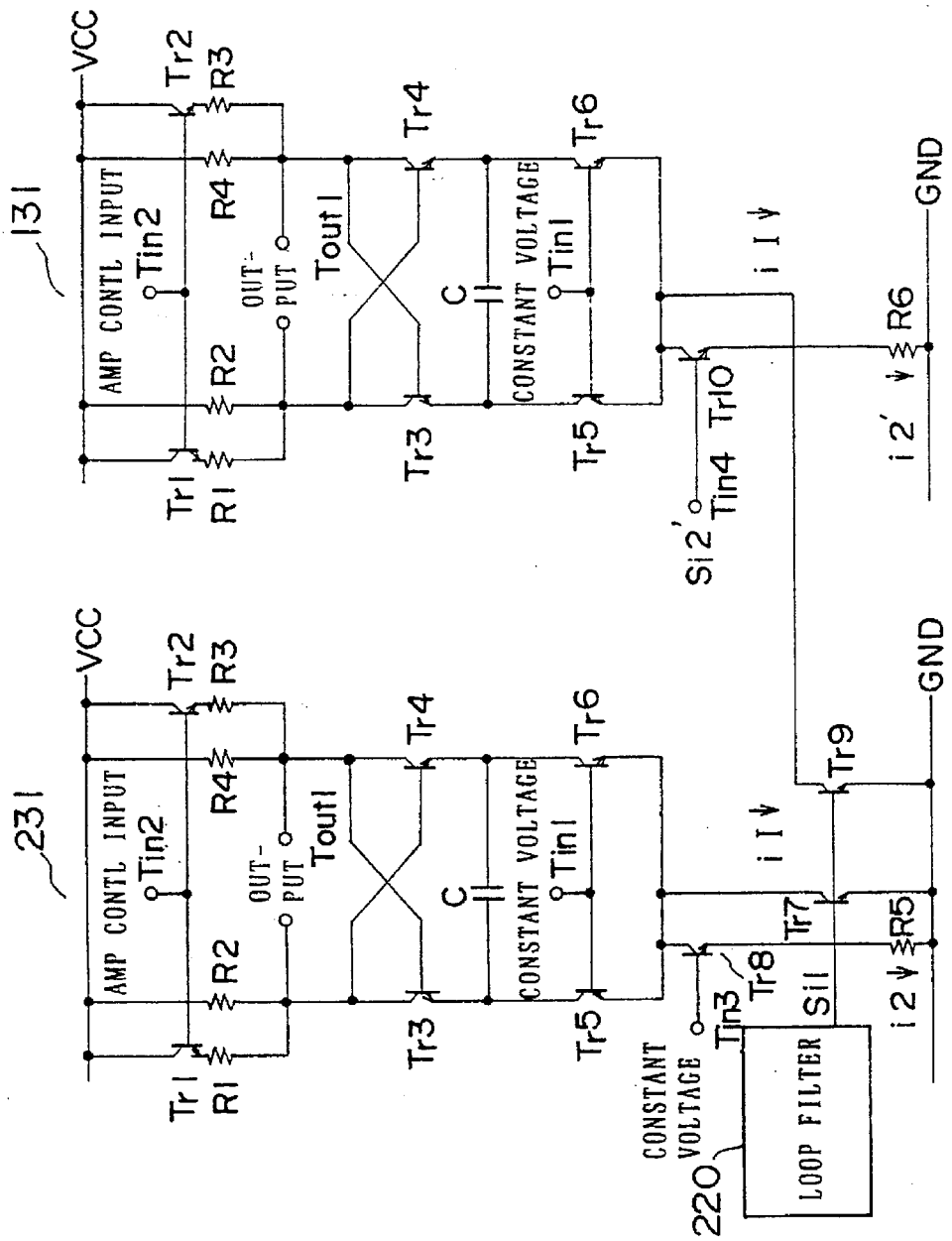
FIG. 10 is a circuit diagram of an essential part of the configuration shown in FIG. 9.

FIG. 10 is a circuit diagram of the non-stable multivibrators 131 and 231 shown in FIG. 9. Each of the non-stable multivibrators 131 and 231 has the same circuit configuration as shown in FIG. 8. In the circuit configuration shown in FIG. 10, the current path connected to the transistors Tr5 and Tr6 of the non-stable multivibrator 231 is branched into a current path including a transistor Tr7 and another current path including a transistor Tr9. Similarly, the current path connected to the transistors Tr5 and TR6 of the non-stable multivibrator 131 is branched into a current path including the transistor Tr9 and another current path including a transistor Tr10. The bases of the transistors Tr7 and Tr9 are supplied with the control signal Si1 from the loop filter 220. The base of the transistor Tr10 is supplied with the control signal Si2' from the loop filter 120 via a control terminal Tin4. A constant voltage is applied to the base of the transistor Tr8 via a control terminal Tin3.

The same currents i1 (the same magnitude) controlled by the control signal Si1 from the loop filter 220 flow in the bases of the transistors Tr7 and Tr9. Hence, the non-stable multivibrators 131 and 231 oscillate at respective frequencies approximately equal to each other. Since the control signal Si2' is applied to the base of the transistor Tr10 via the control terminal Tin4, the oscillation frequency of the non-stable multivibrator 131 is varied by a frequency corresponding to the difference between the constant voltage applied to the control terminal Tin3 and the control signal Si2' applied to the control terminal Tin4. The above frequency variation depends on the result of the phase comparison carried out by the phase comparator 110. Hence, the non-stable multivibrator 131 produces the oscillation signal having the same frequency and phase as those of the serial input data signal Ds.

In order to effectively perform the above-mentioned control operation, it is preferable that i1>i2 in the oscillator 230 and i1>i2' in the oscillator 130. An oscillation frequency approximately equal to the desired oscillation frequency can be obtained by the current i1, and then the frequency and phase of the oscillation signal are made to completely coincide with those of the input data signal Ds.

Figure 11:
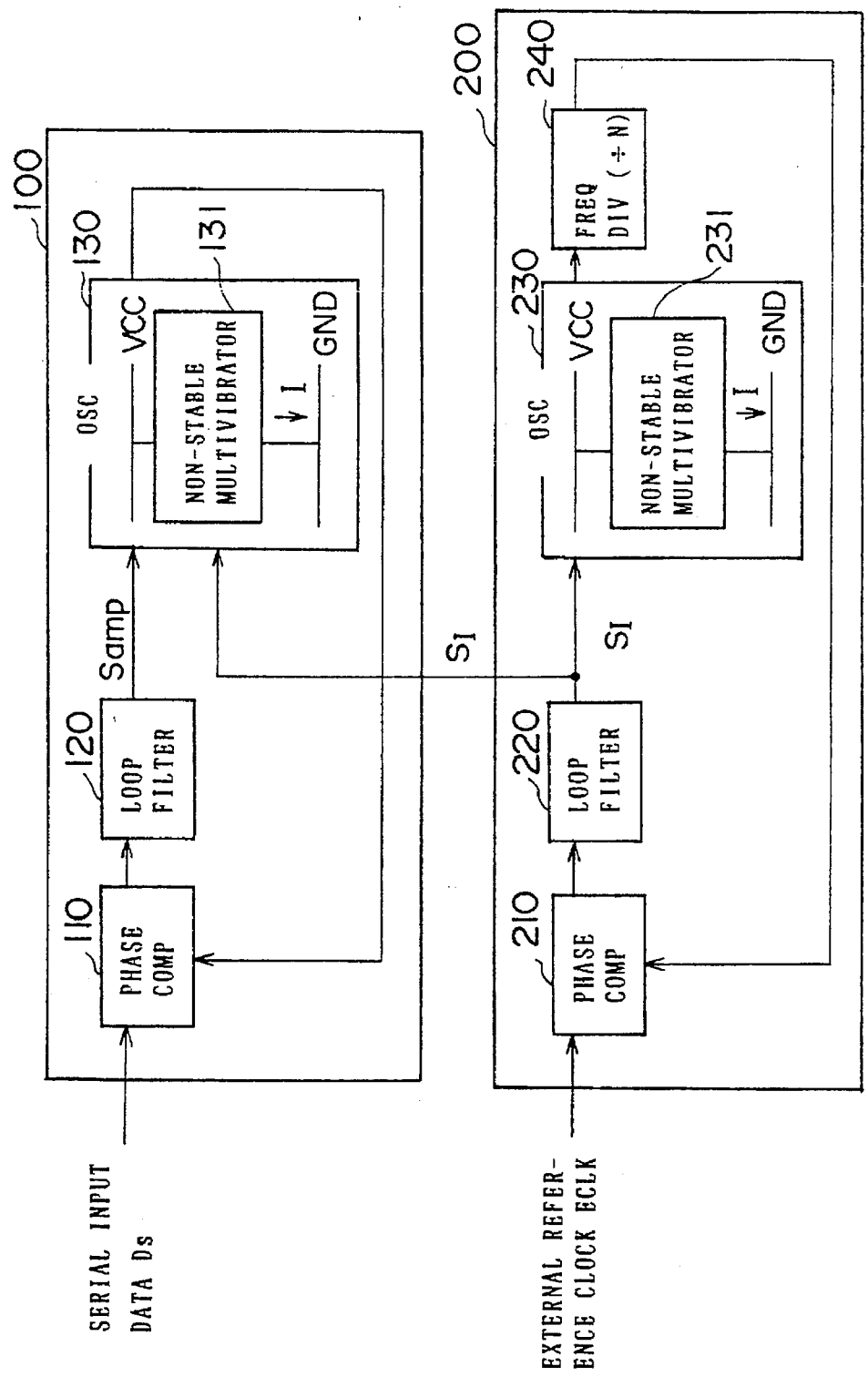
FIG. 11 is a block diagram of a second version of the second embodiment of the present invention.

FIG. 11 is a block diagram of a second version of the configuration shown in FIG. 7, in which the currents I respectively flowing in the non-stable multivibrators 131 and 231 are controlled by the control signal S2 (in FIG. 11, the control signal S2 is particularly expressed as SI) from the loop filter 220. The amplitude of the non-stable multivibrator 131 (the voltage developing across the capacitor C) is controlled by the control signal S1 (in FIG. 7, the control signal S1 is particularly expressed as Samp) from the loop filter 120. The amplitude of the non-stable multivibrator 131 is fixed.

Figure 12:
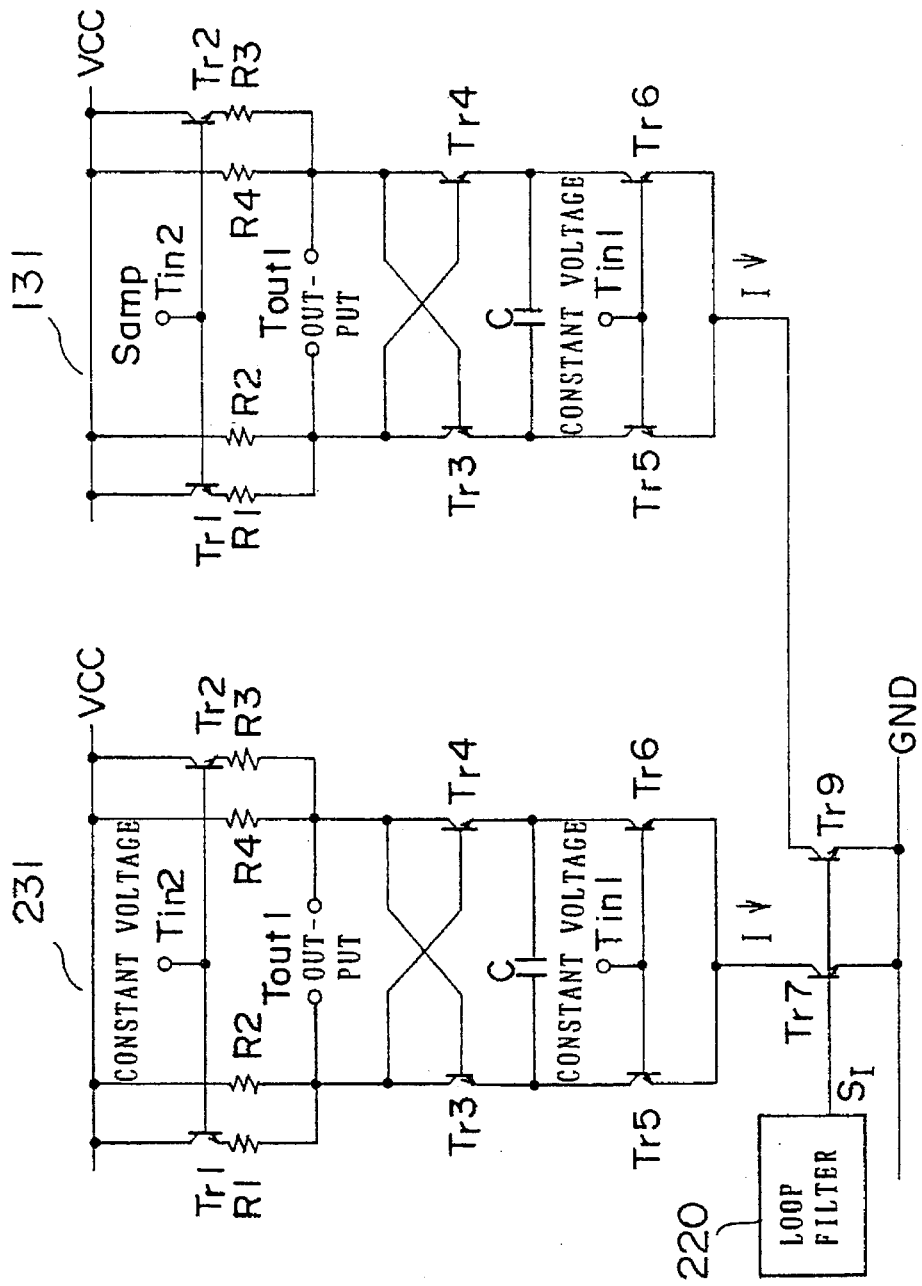
FIG. 12 is a circuit diagram of an essential part of the configuration shown in FIG. 11.

FIG. 12 is a circuit diagram of the circuit configurations of the non-stable multivibrators 131 and 132 shown in FIG. 11. Each of these non-stable multivibrators 131 and 231 has the same configuration as shown in FIG. 7. The configuration shown in FIG. 12 has transistors Tr7 and Tr9. The control signal Samp from the loop filter 120 is applied to the control terminal Tin2 of the non-stable multivibrator 131. A constant voltage is applied to the control terminal of the non-stable multivibrator 231. The same currents I (the same magnitude) controlled by the control signal SI from the loop filter 220 flow in the bases of the transistors Tr7 and Tr9. Hence, the non-stable multivibrators 131 and 231 oscillate at respective frequencies approximately equal to each other. The control signal Samp is applied to the control terminal Tin2 of the non-stable multivibrator 131. The constant voltage is applied to the control terminal Tin2 of the non-stable multivibrator 231. Hence the oscillation frequency of the non-stable multivibrator 131 is varied by a frequency corresponding to the voltage difference between the control signal Samp and the constant voltage. The above frequency variation depends on the result of the phase comparison carried out by the phase comparator 110. Hence, the non-stable multivibrator 131 generates the oscillation signal having the same frequency and phase as those of the serial input data signal Ds.

Figure 13:
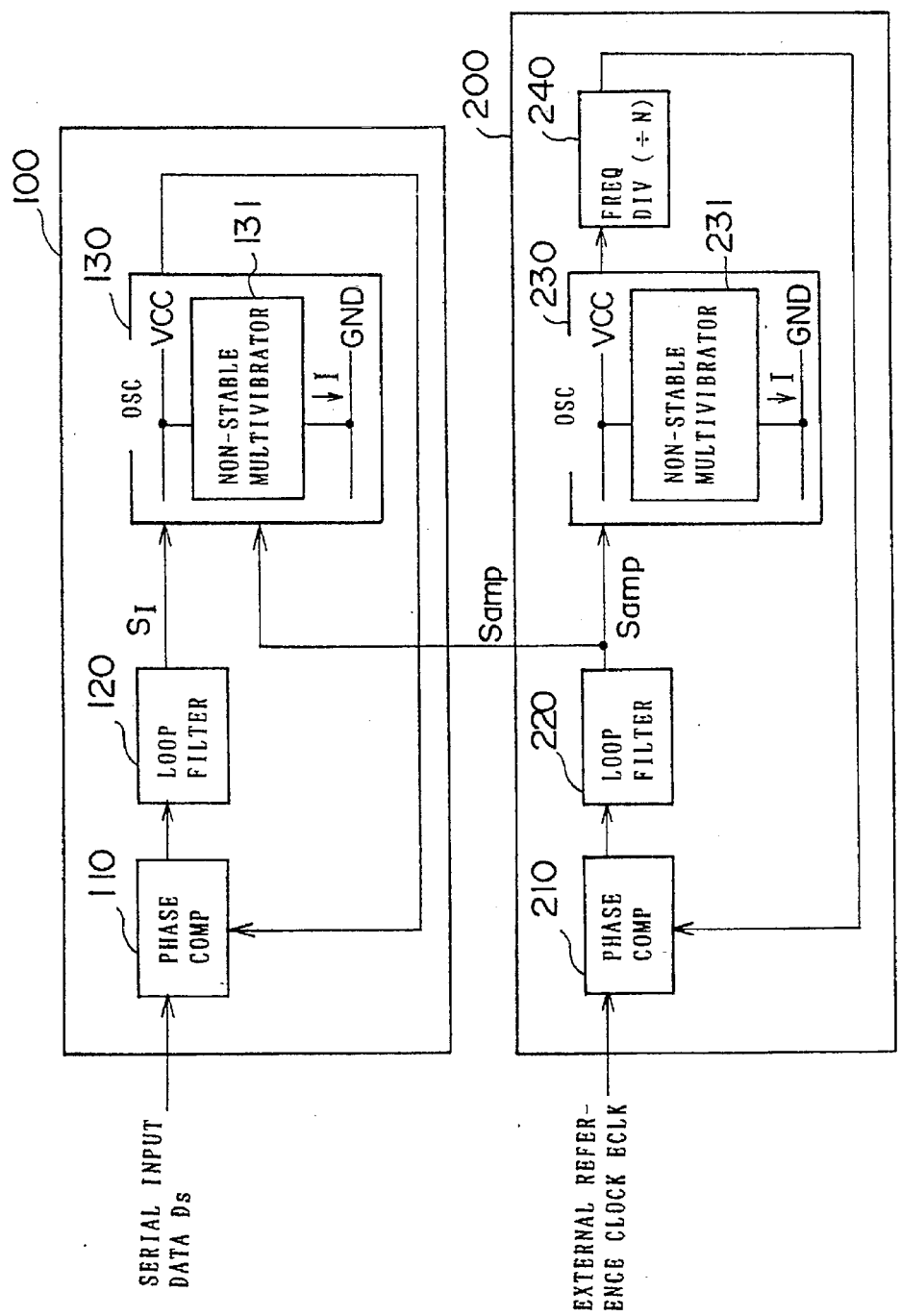
FIG. 13 is a block diagram of a third version of the second embodiment of the present invention.

FIG. 13 is a block diagram of a third version of the configuration shown in FIG. 7, in which the voltages (amplitudes) developing across the capacitors C of the non-stable multivibrators 131 and 231 are controlled by the control signal S2 (which is particularly expressed as Samp in FIG. 13) from the loop filter 220. The current I flowing in the non-stable multivibrator 131 is controlled by the control signal S1 (which is particularly expressed as SI in FIG. 13) from the loop filter 120. The current I flowing in the non-stable multivibrator 131 is fixed. The circuit configuration of the version shown in FIG. 13 will be omitted here because it will be apparent from the previous description. However, when describing the circuit configuration of the version shown in FIG. 13 with reference to FIG. 12, the control signal Samp is applied to the control terminals Tin2 of the non-stable multivibrators 131 and 231, and the control signal SI from the loop filter 120 is applied to the base of the transistor Tr9. The base of the transistor Tr7 is fixed to a constant voltage.

Figure 14:
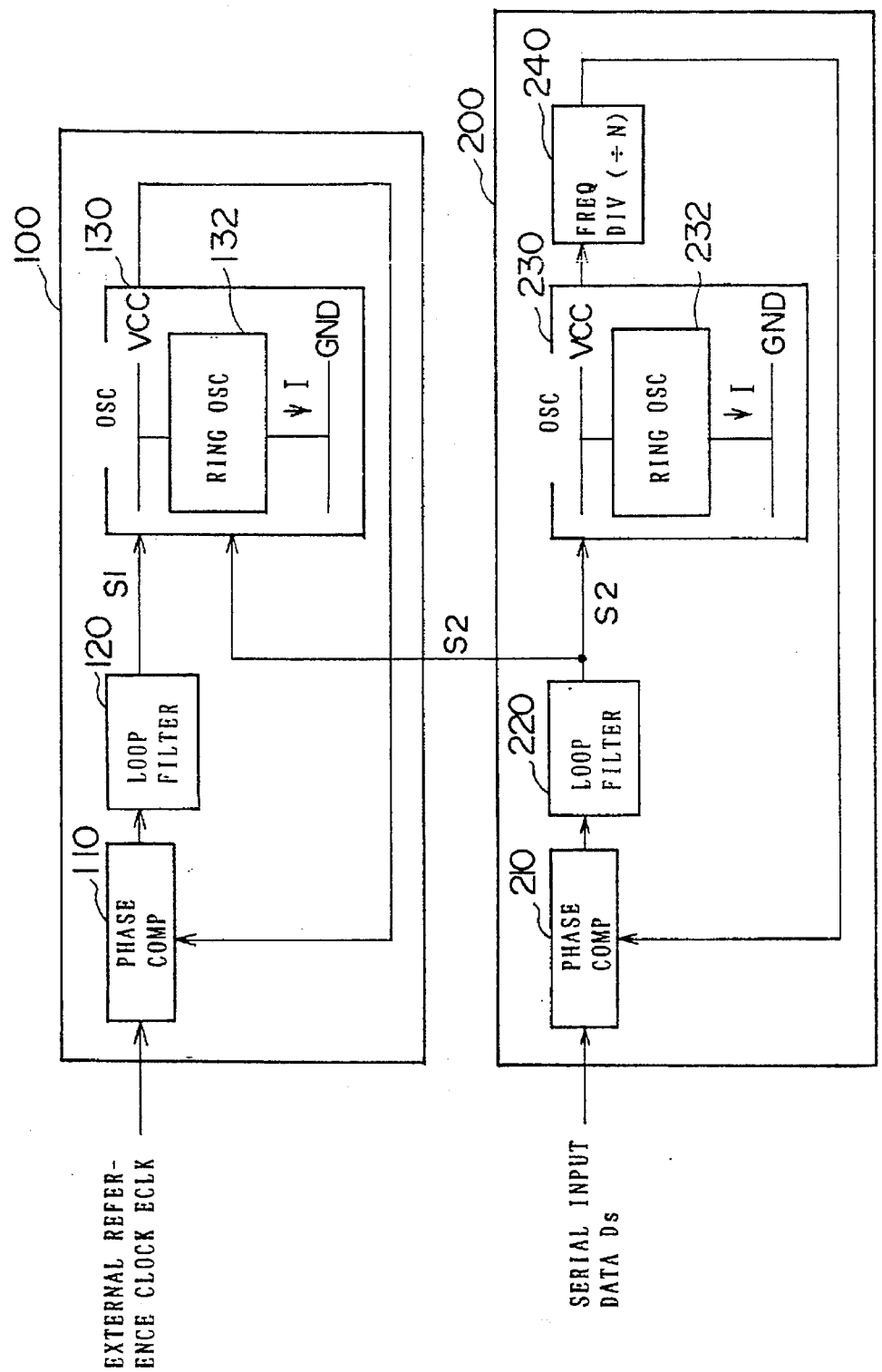
FIG. 14 is a block diagram of a third embodiment of the present invention.

FIG. 14 is a block diagram of a signal processing device in which the oscillators 130 and 230 shown in FIG. 6 are formed with ring oscillators 132 and 232, respectively. A description will now be given of a third embodiment of the present invention corresponding to the above configuration having the ring oscillators 132 and 232. In general, the ring oscillator changes its oscillation frequency by varying a current flowing therein or the amplitude of a signal obtained therein. For example, the control signal S2 output by the loop filter 220 controls the currents I flowing in the ring oscillators 132 and 232. The signal S1 output by the loop filter 120 controls another current or amplitude in the ring oscillator 132. In the above operation, parameters not used to control the oscillation frequency are set to fixed values.

Figure 15:
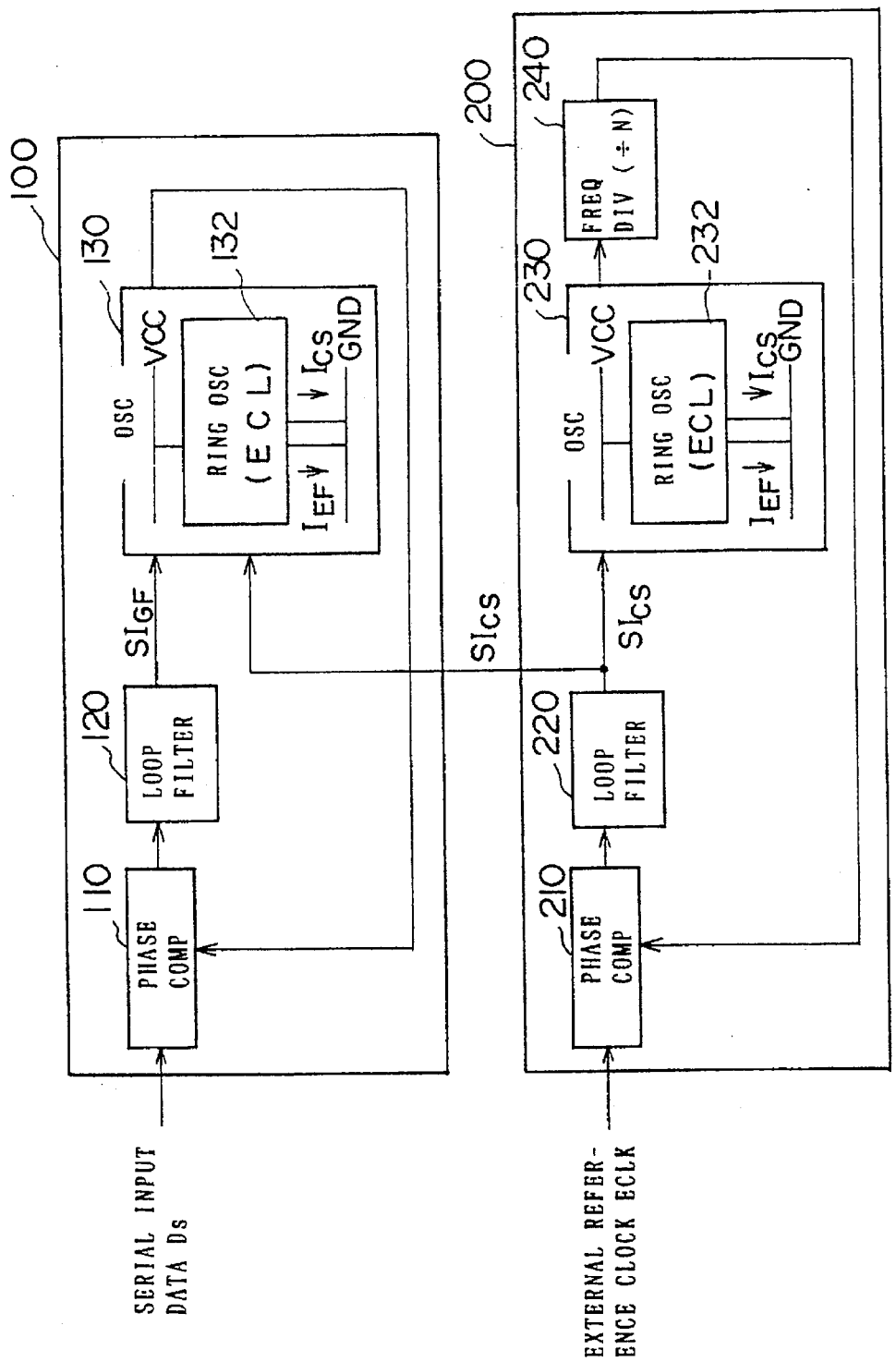
FIG. 15 is a block diagram of a first version of the third embodiment of the present invention.

FIG. 15 is a block diagram of a first version of the configuration shown in FIG. 14, in which a current $I_{CS}$ flowing in the ring oscillator 232 is controlled by the control signal S2 (in FIG. 15, the control signal S2 is particularly expressed as $SI_{CS}$). Another current $I_{EF}$ flows in the ring oscillator 232. The current $I_{CS}$ flowing in the ring oscillator 132 is controlled by the control signal $SI_{CS}$ from the loop filter 220, and the other current $I_{EF}$ flowing therein is controlled by the control signal S1 (which is particularly expressed as $SI_{EF}$ in FIG. 15) from the loop filter 120. The other current $I_{EF}$ flowing in the ring oscillator 231 is set to a fixed value.

Figure 16:
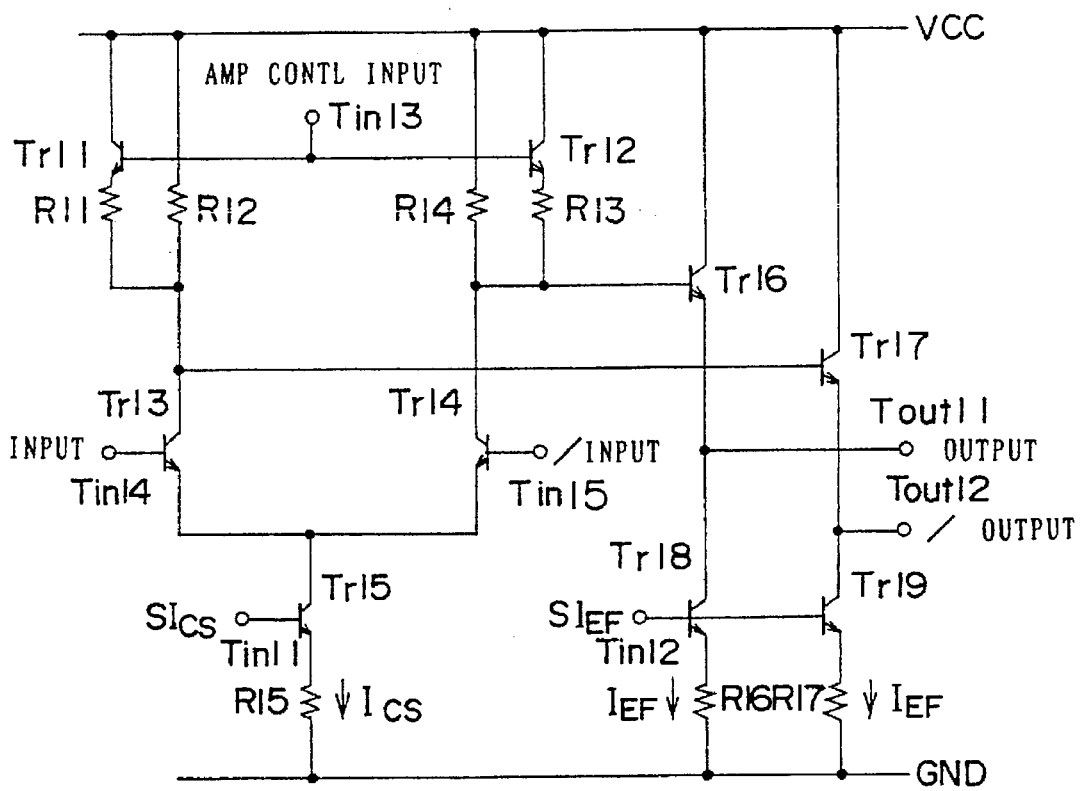
FIG. 16 is a circuit diagram of one stage of a ring oscillator shown in FIG. 15.
Figure 17:
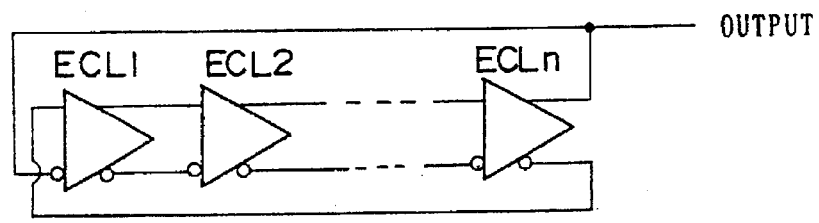
FIG. 17 is a block diagram of the ring oscillator shown in FIG. 15.

FIG. 16 is a circuit diagram of one stage of a ring oscillator using an ECL (Emitter-Coupled Logic) circuit. As shown in FIG. 17, a plurality of ECL circuits (ECL1 through ECLn), each of which is configured as shown in FIG. 16, are cascaded to thereby form a ring oscillator.

As shown in FIG. 16, the ECL circuit forming one stage of the ring oscillator includes transistors TR11 through Tr19, resistors R11 through R17, control terminals Tin11 through Tin13, input terminals Tin14 and Tin15, and output terminals Tout11 and Tout12. If constant voltages are applied to the transistors Tin11, Tin12 and Tin13 and the transistors TR13 and Tr14 are turned ON and OFF, respectively, the current flowing in the transistor Tr13 flows to the ground line GND via the transistor Tr15 (which functions as a constant-current source) and the resistor R15. The collector potential of the transistor Tr13 is decreased, and hence the transistor Tr17 is turned OFF, and the output terminal Tout12 becomes low. The base potential of the transistor Tr16 is approximately equal to the power supply voltage VCC. Hence, the transistor Tr16 is turned ON and the output terminal Tout11 becomes high. When the transistors Tr13 and Tr14 are turned OFF and ON, respectively, the collector potential of the transistor Tr14 is decreased and the collector potential of the transistor Tr13 is increased. Hence, the transistors Tr16 and T17 are turned OFF and ON, respectively, and the output terminals Tout11 and Tout12 become low and high, respectively.

The current $I_{CS}$ flowing in the transistor Tr15 can be varied by controlling its base potential. The currents flowing in the transistors Tr18 and Tr19 can be varied by controlling the base potentials thereof. Further, the amplitudes of the input and output signals can be varied by controlling the base potentials of the transistors Tr11 and Tr12.

Figure 18:
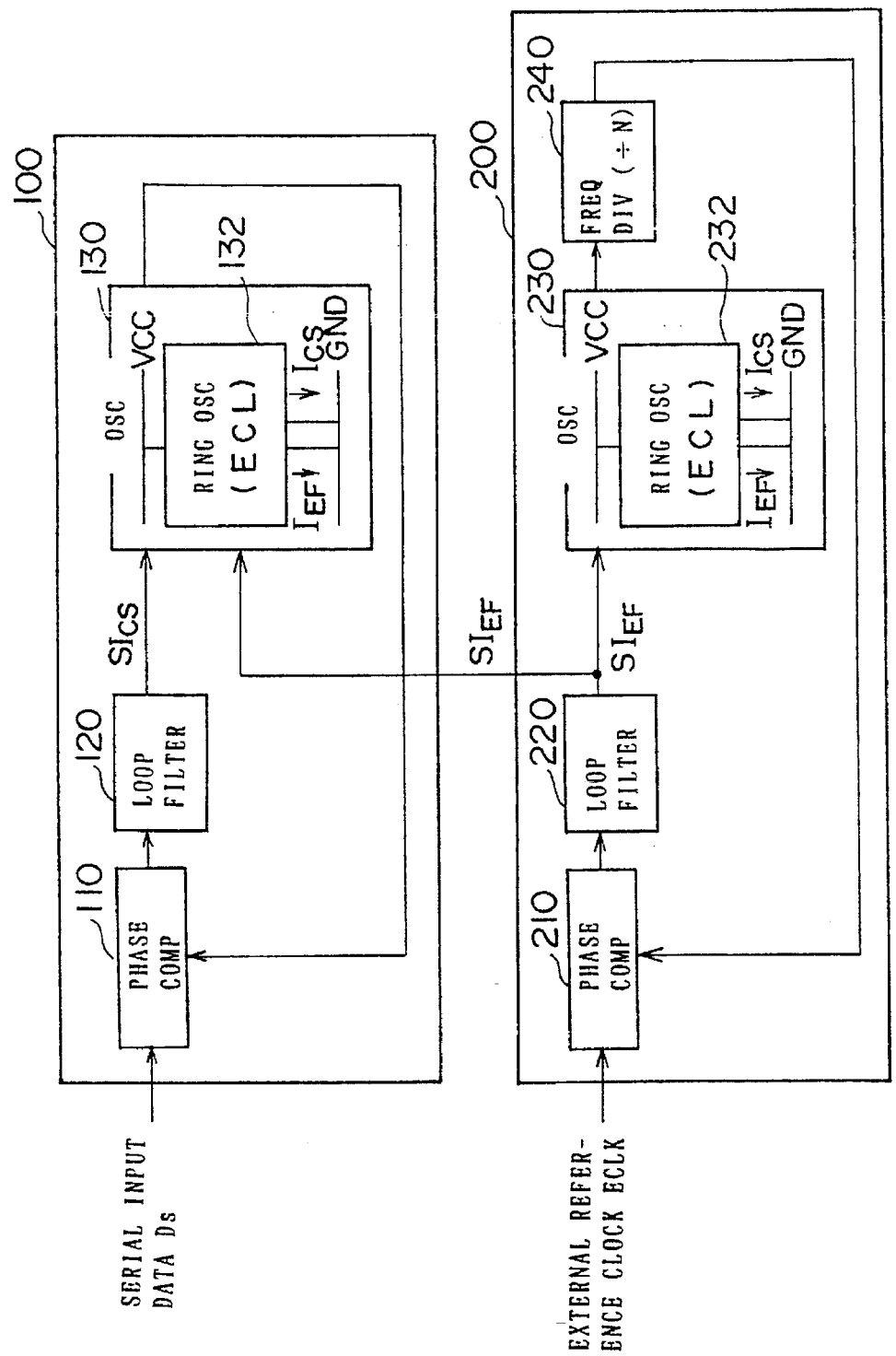
FIG. 18 is a block diagram of a second version of the third embodiment of the present invention.

FIG. 18 is a block diagram of a second version of the configuration shown in FIG. 15, in which the current $I_{EF}$ flowing in the ring oscillator 232 (in which the current $I_{EF}$ also flows) is controlled by the control signal S2 (which is particularly expressed as $SI_{EF}$ IN FIG. 18). The current $I_{EF}$ flowing in the ring oscillator 132 is controlled by the control signal $SI_{EF}$ from the loop filter 220, and the other current $I_{CS}$ flowing therein is controlled by the control signal S1 (which is particularly expressed as $SI_{CS}$ in FIG. 18) from the loop filter 120. The other current $I_{CS}$ flowing in the ring oscillator 232 is fixed to a constant value. More particularly, the control signal $Si_{EF}$ from the loop filter 220 is applied to the control terminals Tin12 (FIG. 16) of the stages of the ring oscillators 232 and 132. The control signal $Si_{CS}$ from the loop filter 120 is applied to the control terminal Tin11 of the stages of the ring oscillator 132. A constant voltage is applied to the control terminal Tin11 of each of the stages of the ring oscillator 132. A constant voltage is applied to the control terminal Tin13 of each of the stages of each of the ring oscillators 132 and 232.

Figure 19:
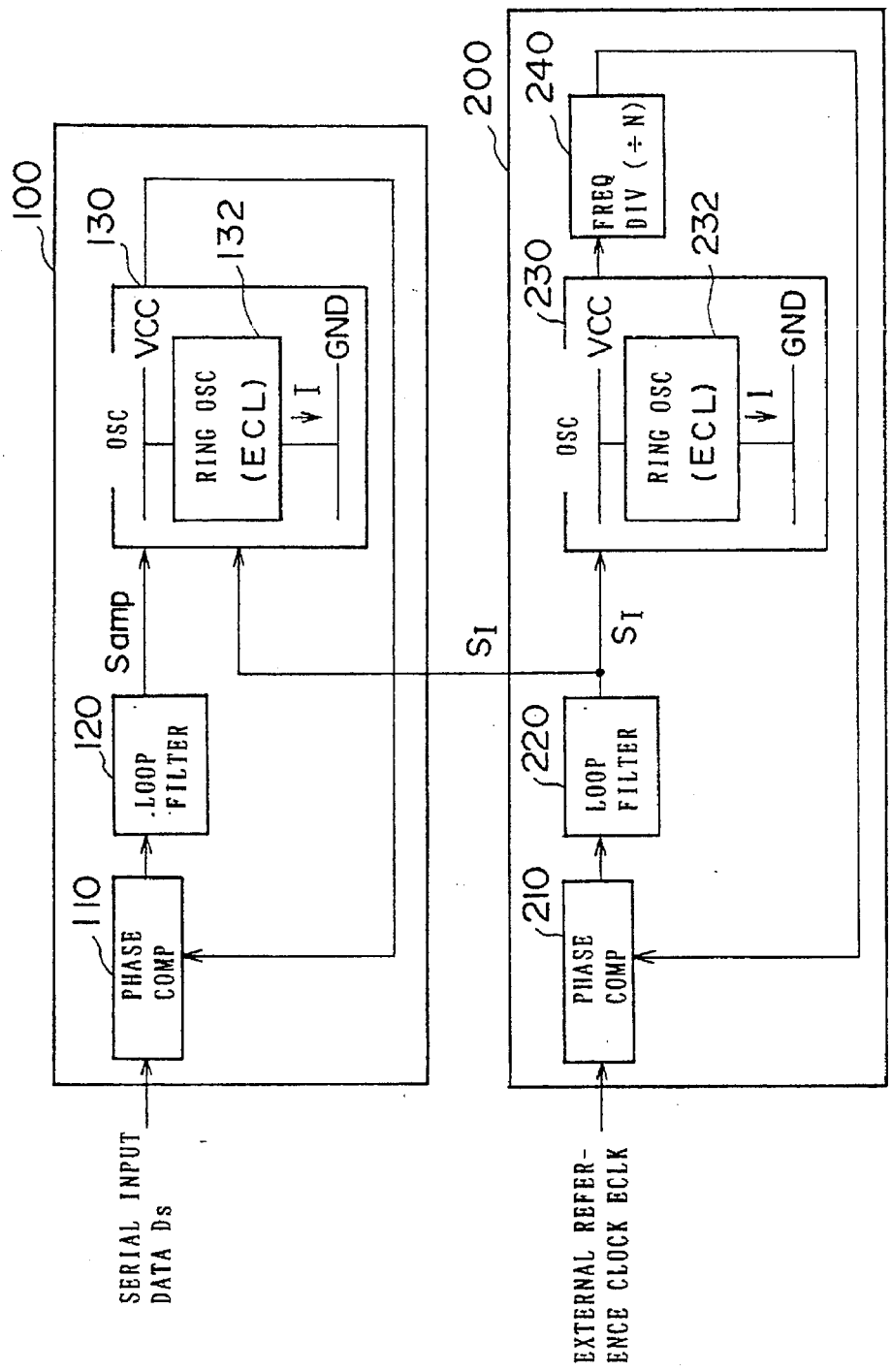
FIG. 19 is a block diagram of a third version of the third embodiment of the present invention.

FIG. 19 is a block diagram of a third version of the configuration shown in FIG. 15, in which the currents I flowing in the ring oscillators 132 and 232 are controlled by the control signal S2 (which is particularly expressed as SI in FIG. 19). The signal amplitude of the ring oscillator 132 is controlled by the control signal S1 (which is particularly expressed as Samp) from the loop filter 120. The singla amplitude of the ring oscillator 232 is set to a fixed value. More particularly, the control signal SI from the loop filter 220 is applied to the control terminals Tin12 (FIG. 16) of the stages of each of the ring oscillators 232 and 132. The control signal Samp from the loop filter 120 is applied to the control terminal Tin13 of each stage of the ring oscillator 132. A constant voltage is applied to the control terminals Tin11 of the stages of each of the ring oscillators 132 and 232. A constant voltage is applied to the control terminal Tin13 of each stage of the ring oscillator 232.

Figure 20:
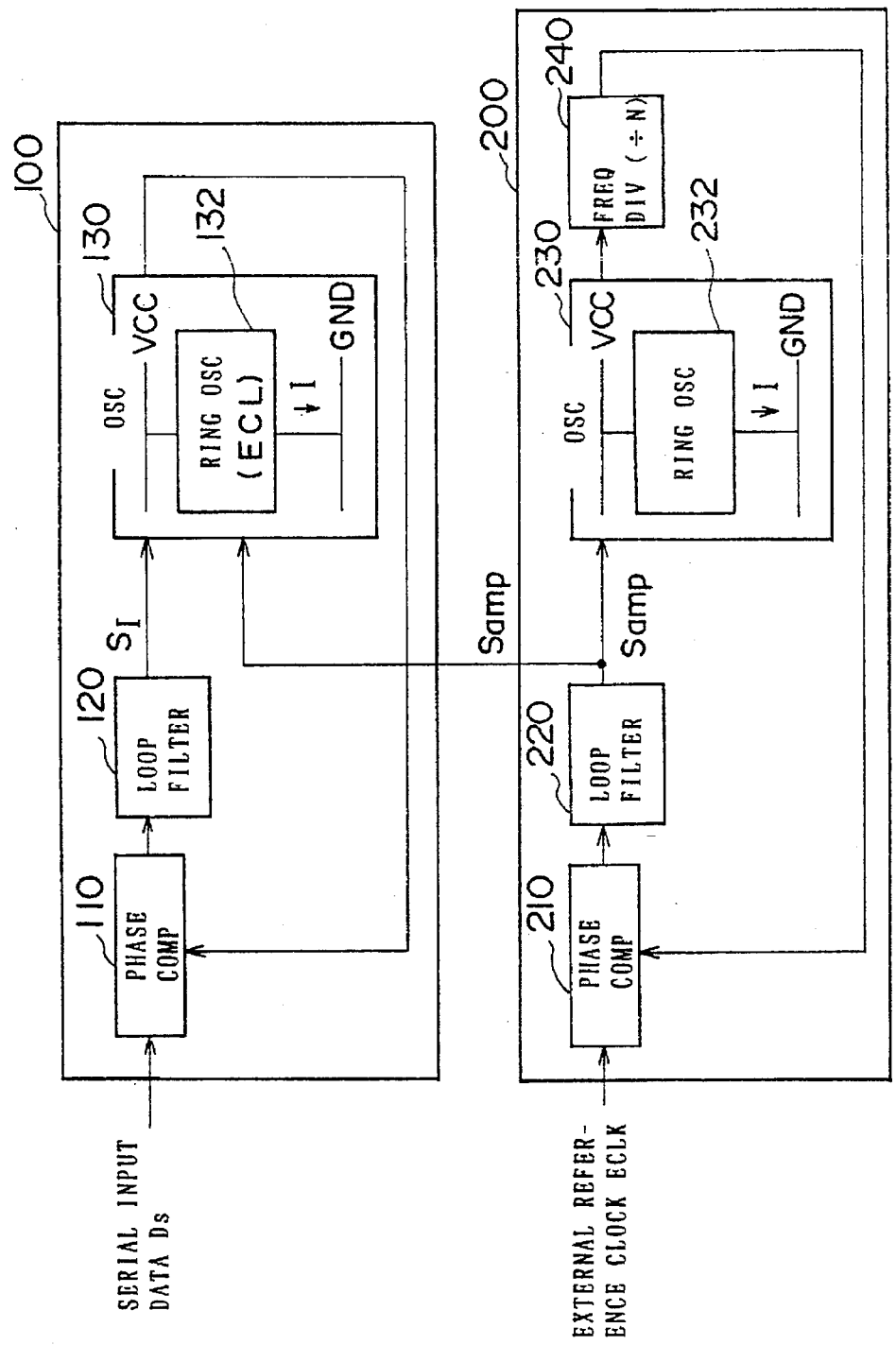
FIG. 20 is a block diagram of a fourth version of the third embodiment of the present invention.

FIG. 20 is a block diagram of a fourth version of the configuration shown in FIG. 15, in which the signal amplitudes of the ring oscillators 132 and 2323 are controlled by the control signal S2 (which is particularly expressed as Samp in FIG. 20). The signal amplitude of the ring oscillator 132 is controlled by the control signal S1 (which is particularly expressed as SI in FIG. 20) from the loop filter 120. The current flowing in the ring oscillator 232 is fixed to a constant value. More particularly, the control signal Samp from the loop filter 220 is applied to the control terminals Tin13 (FIG. 16) of each stage of each of the ring oscillators 132 and 232. The control signal SI form the loop filter 120 is applied to, for example, the control terminal Tin12 of each stage of the ring oscillator 132. A constant voltage is applied to the control terminal Tin11 of each stage of each of the ring oscillators 132 and 232. A constant voltage is applied to the control terminal Tin12 of each stage of the ring oscillator 232.

The configurations using the non-stable multivibrators have been explained as the second embodiment of the present invention, and the configurations using the ring oscillators have been explained as the third embodiment of the present invention. However, the oscillators 130 and 230 are not limited to these types of oscillators, and other types of oscillators can be used.

Figure 21:
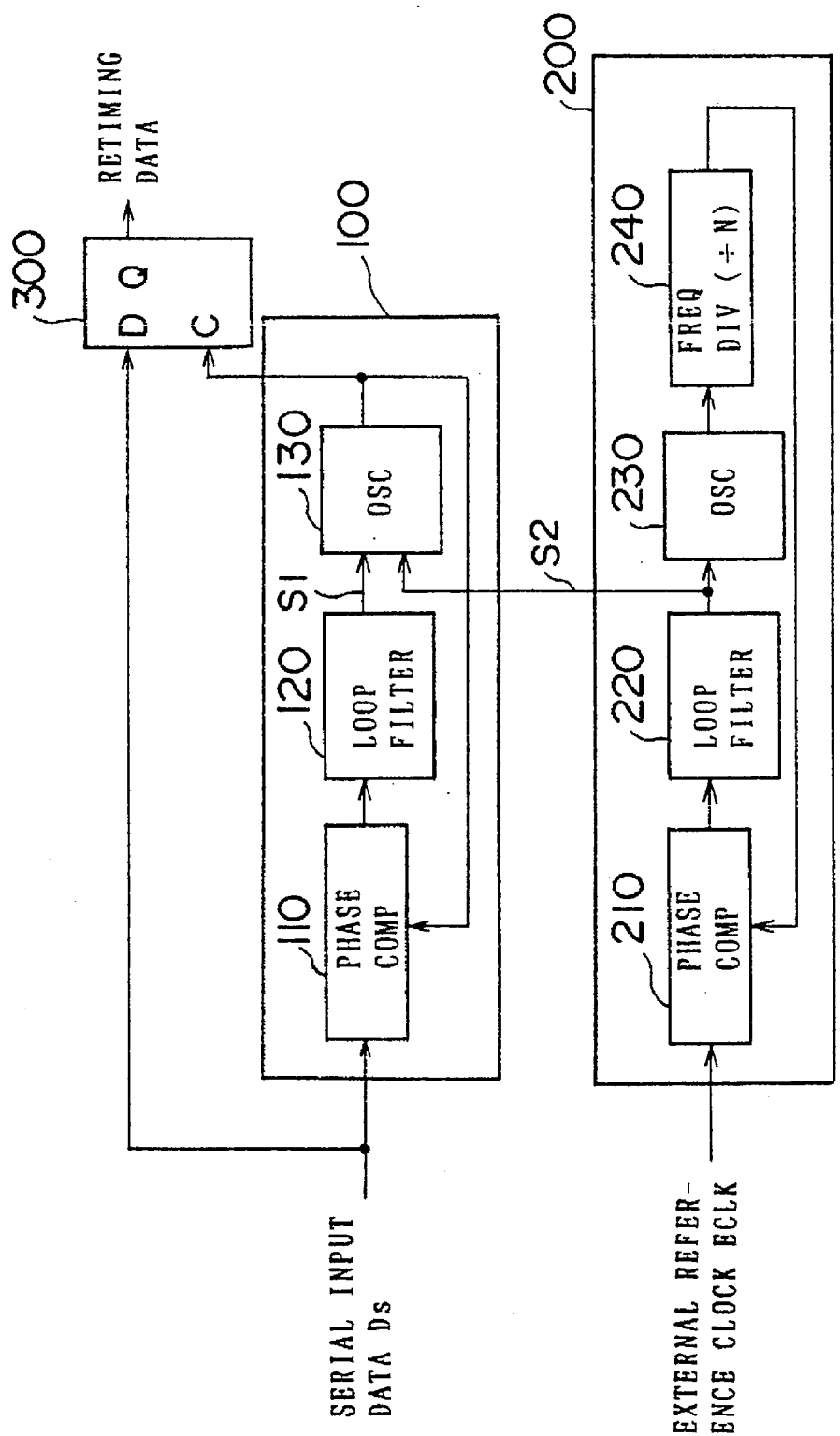
FIG. 21 is a block diagram of a first application of the first through third embodiments of the present invention.

FIG. 21 is a block diagram of a first application of the first through third embodiments of the present invention. The configuration shown in FIG. 21 is obtained by adding a D-type flip-flop 300 to the configuration shown in FIG. 6. The flip-flop 300 latches the serial input data signal Ds in synchronism with the rising edge of the clock signal having the frequency M (Hz) output by the oscillator 130. That is, the flip-flop 300 retimes the serial input data signal Ds. Hence, a jitter or the like can be eliminated from the input signal, and the clear signal can be reproduced.

Figure 22:
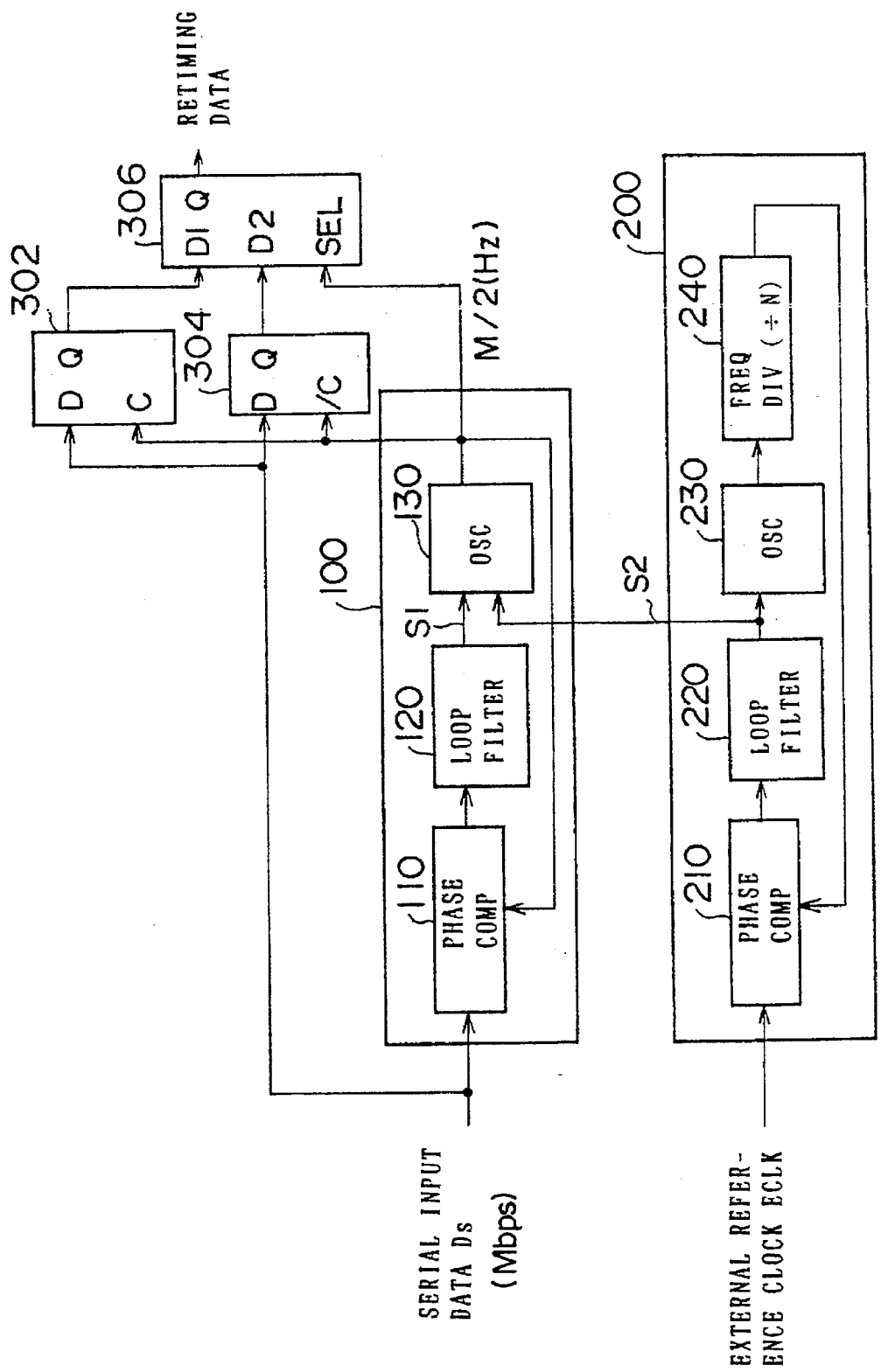
FIG. 22 is a block diagram of a second application of the first through third embodiments of the present invention.

FIG. 22 is a block diagram of a second application of the first through third embodiments of the present invention. The configuration shown in FIG. 22 is obtained by adding two D-type flip-flops 302 and 304, and a selector 306 to the configuration shown in FIG. 6. When the input data signal Ds has a bit rate M (bps), the oscillators 130 and 230 shown in FIG. 22 oscillate at frequency M/2 (Hz). The clock signal having the frequency M/2 (Hz) output by the oscillator 130 is applied to the clock terminal of the flip-flop 302 and the inverted clock terminal of the flip-flop 304. Hence, the flip-flops 302 and 304 alternately latch the input data signal Ds in synchronism with the rising edge and the falling edge of the clock signal, and output the latched signals to the selector 306. The selector 306 alternately selects either the flip-flop 302 or the flip-flop 304 according to the clock signal from the oscillator 130. Hence, the selector 306 outputs the retimed input data signal Ds. The configuration shown in FIG. 22 is advantageous to the configuration shown in FIG. 21 in that the oscillation frequencies of the oscillators 130 and 230 shown in FIG. 22 are half of those shown in FIG. 21.

Figure 23:
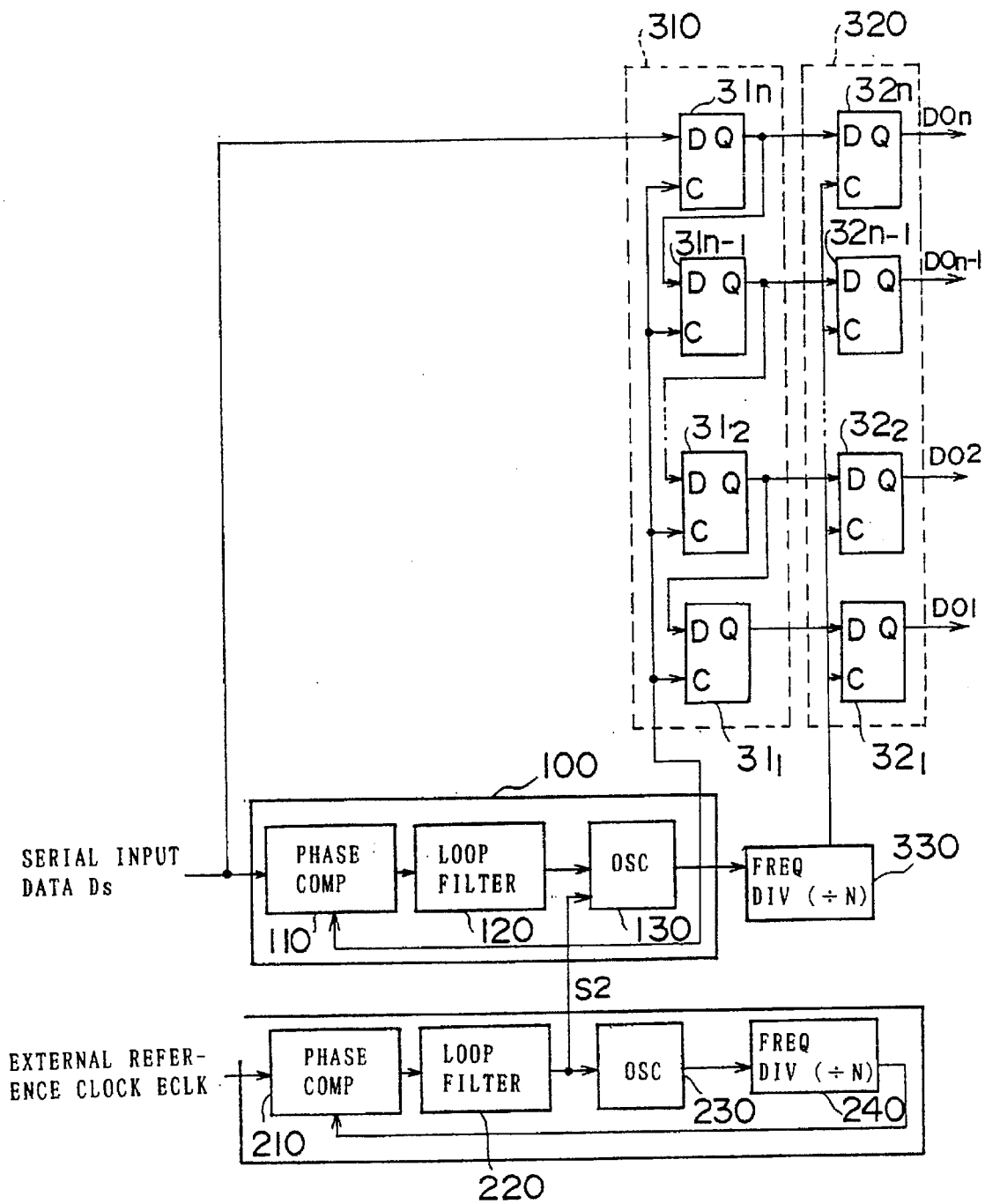
FIG. 23 is a block diagram of a third application of the first through third embodiments of the present invention.

FIG. 23 is a block diagram of a third application of the first through third embodiments of the present invention. The configuration shown in FIG. 23 is obtained by adding a shift register unit 310, a data latch unit 320 and a frequency divider 330 to the configuration shown in FIG. 6. With the above configuration, the application shown in FIG. 23 has the function of converting the serial input data signal Ds into parallel data signals DO1 through DOn. When the bit rate of the input data signal Ds is M (bps), the oscillators 130 and 230 shown in FIG. 23 oscillate at frequency M (Hz). The clock signal having the frequency M (Hz) output by the oscillator 130 is applied to the shift register unit 310 and the frequency divider 330. The shift register unit 310 includes n cascaded D-type flip-flops $31_1$ through $31_n$ where n is an integer. The clock signal of the frequency M (Hz) is applied to the clock terminals C of the flip-flops $31_1$ through $31_n$. A clock signal having a frequency M/n (Hz) is generated from the clock signal of the frequency M by means of the frequency divider 330, and is applied to the data latch unit 320. The data latch unit 320 has n cascaded D-type flip-flops $32_1$ through $32_n$. The clock signal of the frequency M/n (Hz) is applied to the clock terminals C of the flip-flops $32_1$ through $32_n$. The shift register unit 310 shifts the serial input data signal Ds in synchronism with the clock signal having the frequency M (Hz). When the input data signal Ds is shifted by n bits, the data latch unit 320 latches n bits of the input data signal Ds in synchronism with the clock signal from the frequency divider 330 and outputs the parallel data DO1 through DOn.

Figure 24:
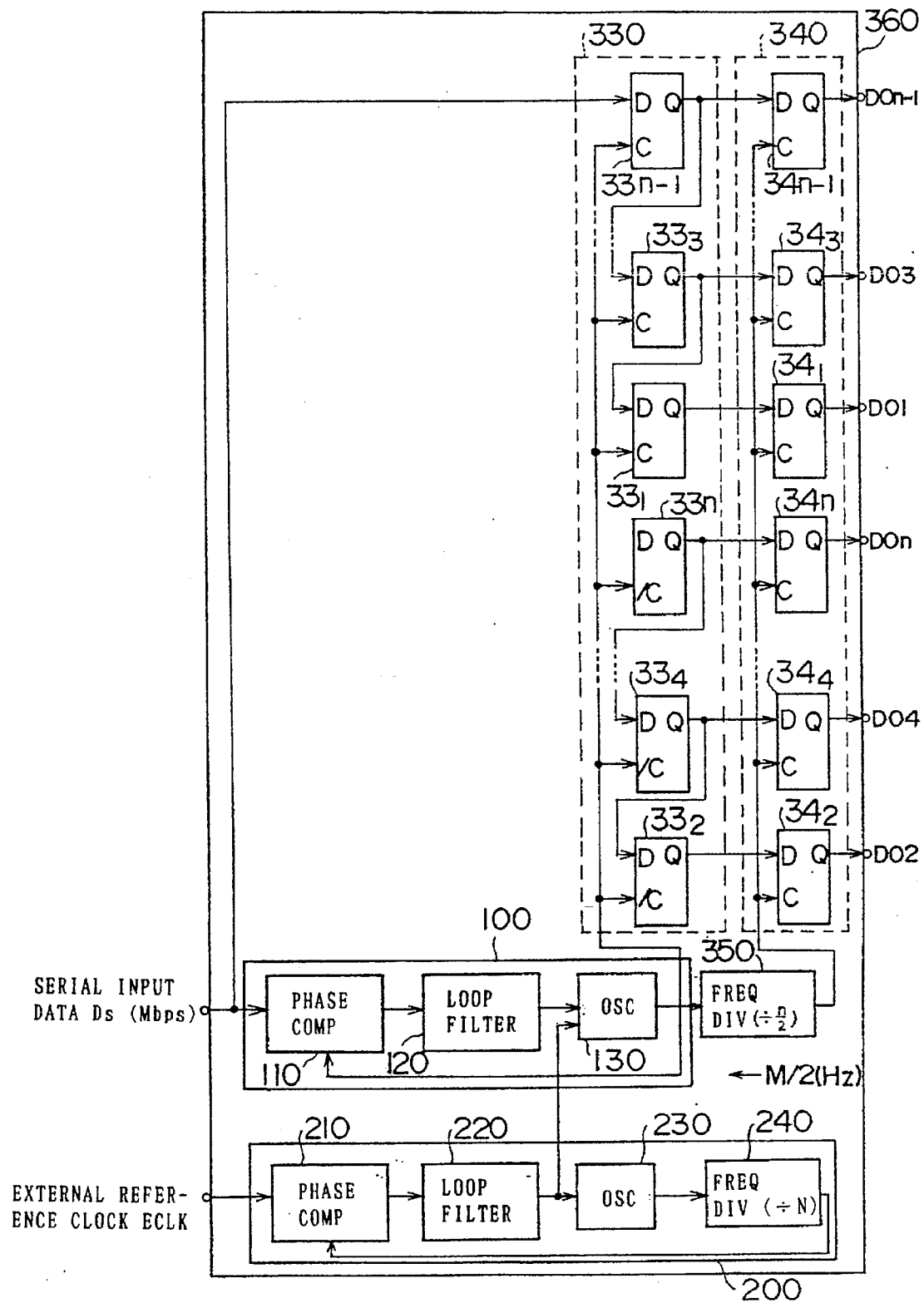
FIG. 24 is a block diagram of a fourth application of the first through third embodiments of the present invention.

FIG. 24 is a block diagram of a fourth application of the first through third embodiments of the present invention.

The configuration shown in FIG. 24 is obtained by adding a shift register unit 330, a data latch unit 340 and a frequency divider 350 to the configuration shown in FIG. 6. With the above configuration, the fourth application shown in FIG. 24 has the function of converting the serial input data signal Ds into parallel data signals DO1 through Don (a serial-to-parallel conversion circuit or a demultiplexer circuit). The fourth application differs from the third application in that the oscillators 130 and 230 oscillate at frequency M/2 (Hz) with the bit rate of the input data signal Ds equal to M (bps). The M/2 Hz clock signal output by the oscillator 130 is applied to the shift register unit 330 and the frequency divider 350. The shift register unit 350 has n cascaded D-type flip-flops $31_1$ through $31_n$ where n is an integer. The n flip-flops $31_1$ through $31_n$ are grouped into two groups, which respectively receive the serial input data signal Ds. This is accomplished by setting the frequency of the clock signal applied to the flip-flops $31_1$ through $31_n$ to M/2 (Hz). The frequency divider 350 generates the clock signal having the frequency M/2n (Hz) from the clock signal having the frequency M/2 (Hz), and outputs it to the data latch unit 340. The data latch unit 340 includes n cascaded D-type flip-flops $34_1$ through $34_n$ where n is an integer. The clock signal having the frequency M/2n (Hz) is applied to the clock terminals C of the flip-flops $34_1$ through $34_n$. The shift register unit 330 shifts the serial input data signal Ds in synchronism with the clock signal of the frequency M/2 (Hz). When the n bits of the input data signal Ds are shifted, the data latch unit 340 latches the n bits of the input data signal Ds in synchronism with the clock signal from the frequency divider 350, and outputs parallel data DO1 through DOn.

The configuration shown in FIG. 24 is formed on a chip 360. The chip 360 externally receives the serial input data signal Ds and the external reference clock signal ECLK, and outputs the parallel output data DO1 through DOn. As will be described later, the chip 360 is connected to an external power supply.

As in the case of the configuration shown in FIG. 24, it is preferable that each of the first through third applications be formed on one chip. Thereby, two PLL circuits 100 and 200 can be simultaneously produced by the same process, and have the same performance. It is also preferable that power supply systems be independently (separately) provided with respect to the two PLL circuits 100 and 200.

Figure 25:
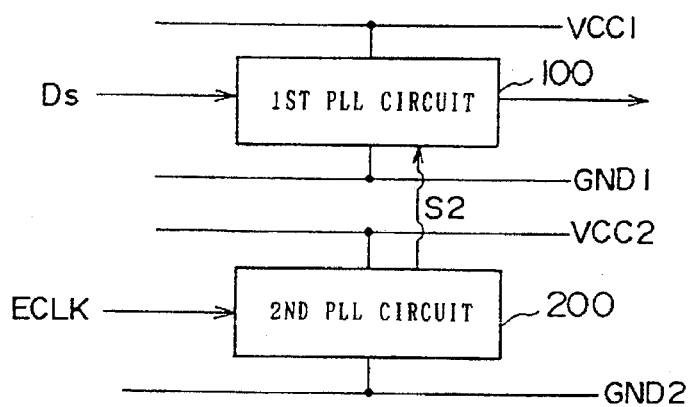
FIG. 25 is a diagram of a preferable power supply system used for the first through third embodiments of the present invention.

FIG. 25 shows preferable power supply systems used for the first to fourth applications. As shown in FIG. 25, the first PLL circuit 100 is provided between a power supply line VCC1 and a ground line GND1, and the second PLL circuit 200 is provided between a power supply line VCC2 and a ground line GND2. The power supply system including the lines VCC1 and GND1 is separated from the power supply system including the lines VCC2 and GND2. It is preferable that the power supply system including the lines VCC1 and GND1 is connected to a power source separately from a power source to which the power supply system including the lines VCC2 and GND2 is connected. With the above structure, it is possible to prevent an interference of noises superimposed on the power supply systems.

By separately providing the two power supply systems, it is preferable that the transistors Tr7 and Tr9 shown in FIG. 10 are driven by the same power supply line; i.e., connected to the power supply line GND2 in the example shown in FIG. 25. This is because the control signal generated by the second PLL circuit 200 is also used to control the oscillator 130 of the first PLL circuit 100.

Figure 26:
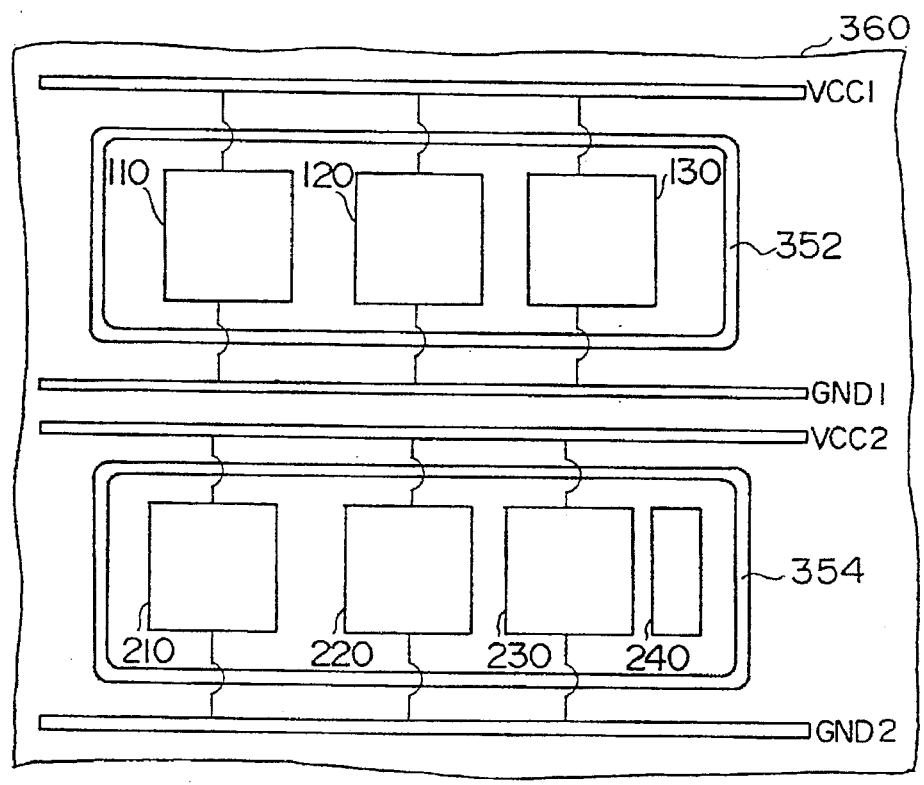
FIG. 26 is a schematic plan view of an essential part of a chip having a shield structure used for the first through third embodiments of the present invention.

FIG. 26 is a schematic plan view of a part of a chip on which the first PLL circuit 100 and the second PLL circuit 200 are formed. As shown in FIG. 26, the phase comparator 110, the loop filter 120 and the oscillator 130 forming the first PLL circuit 100 is enclosed by a isolation area 352. Similarly, the phase comparator 210, the loop filter 220 and the oscillator 230 forming the second PLL circuit 200 are enclosed by an isolation area 354. With use of the isolation areas 352 and 354, it is possible to prevent the interference between the first PLL circuit 100 and the second PLL circuit 200.

Figure 1:
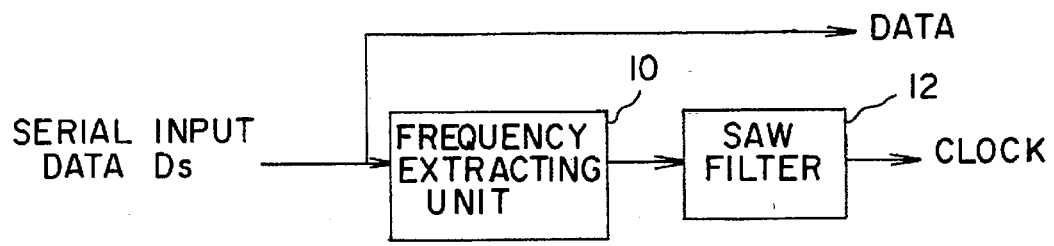
FIG. 1 is a block diagram of a conventional clock generating circuit.
Figure 2:
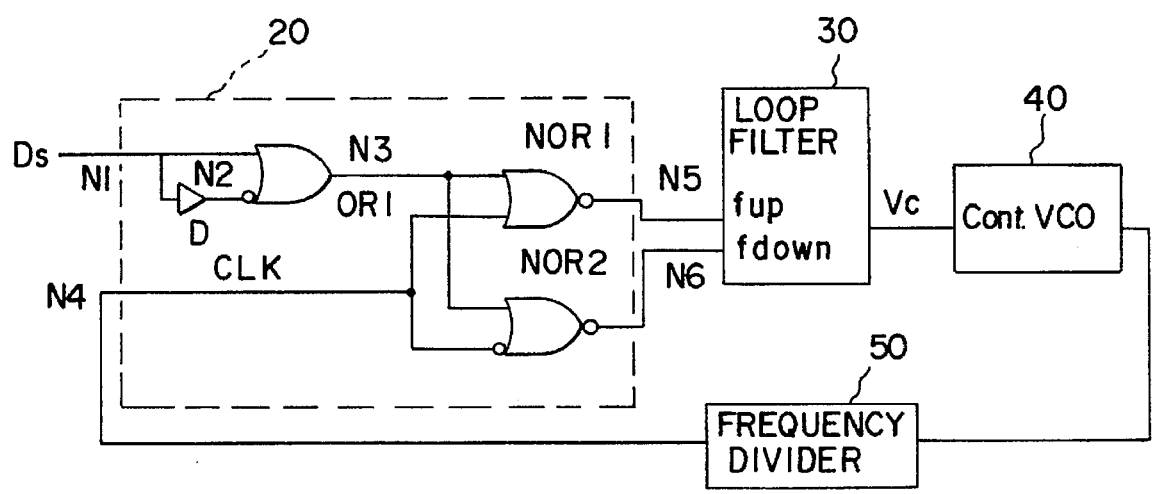
FIG. 2 is a block diagram of another conventional clock generating circuit using a PLL circuit.
Figure 3:
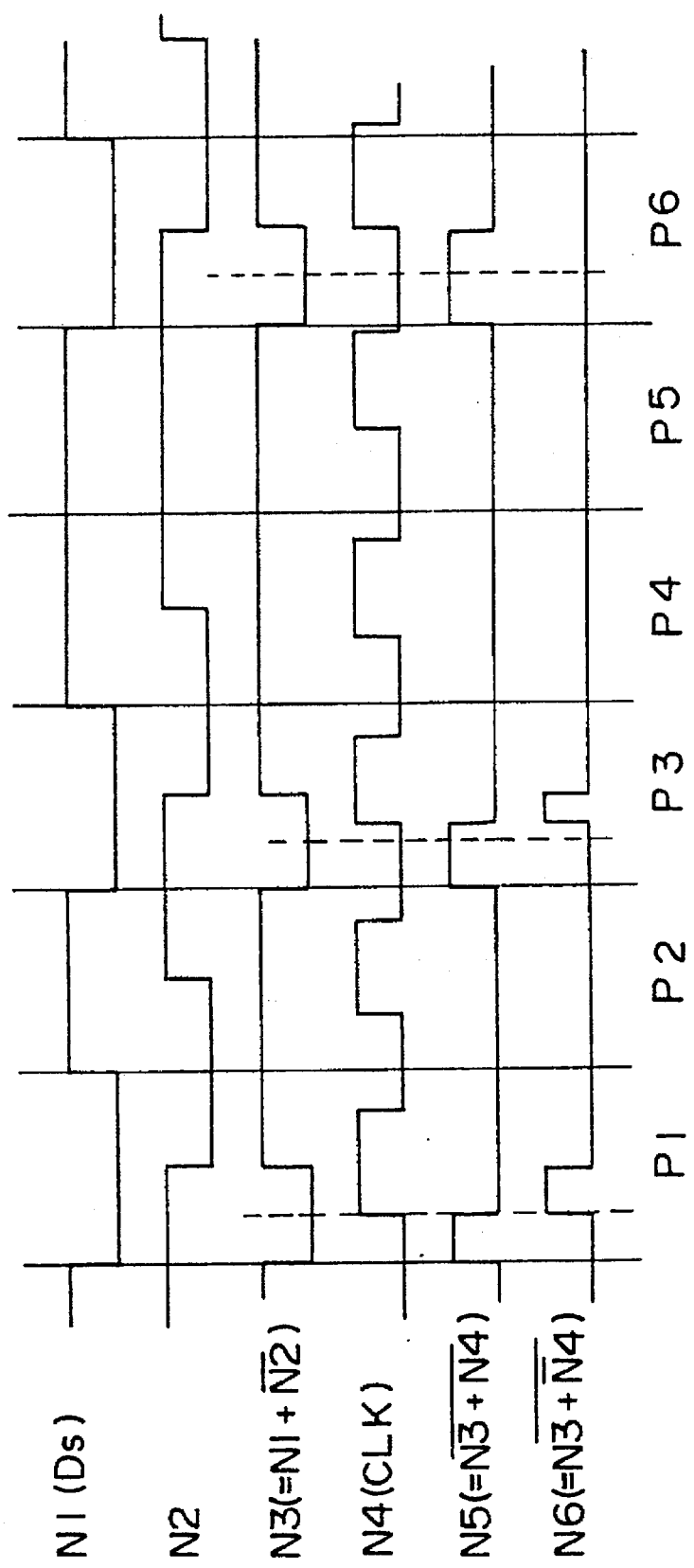
FIG. 3 is a timing chart of the normal operation of the circuit shown in FIG. 2.

The first PLL circuit 100 and the second PLL circuit 200 may have the configuration shown in FIG. 2. However, in order to overcome the above-mentioned problems, it is preferable that at least the first PLL circuit 100 has the following configuration. With the following configuration, it is possible to stably and precisely perform the phase comparing operation even when the clock signal used for the phase comparing operation is equal to or lower than the frequency of the serial input data signal Ds.

Figure 27:
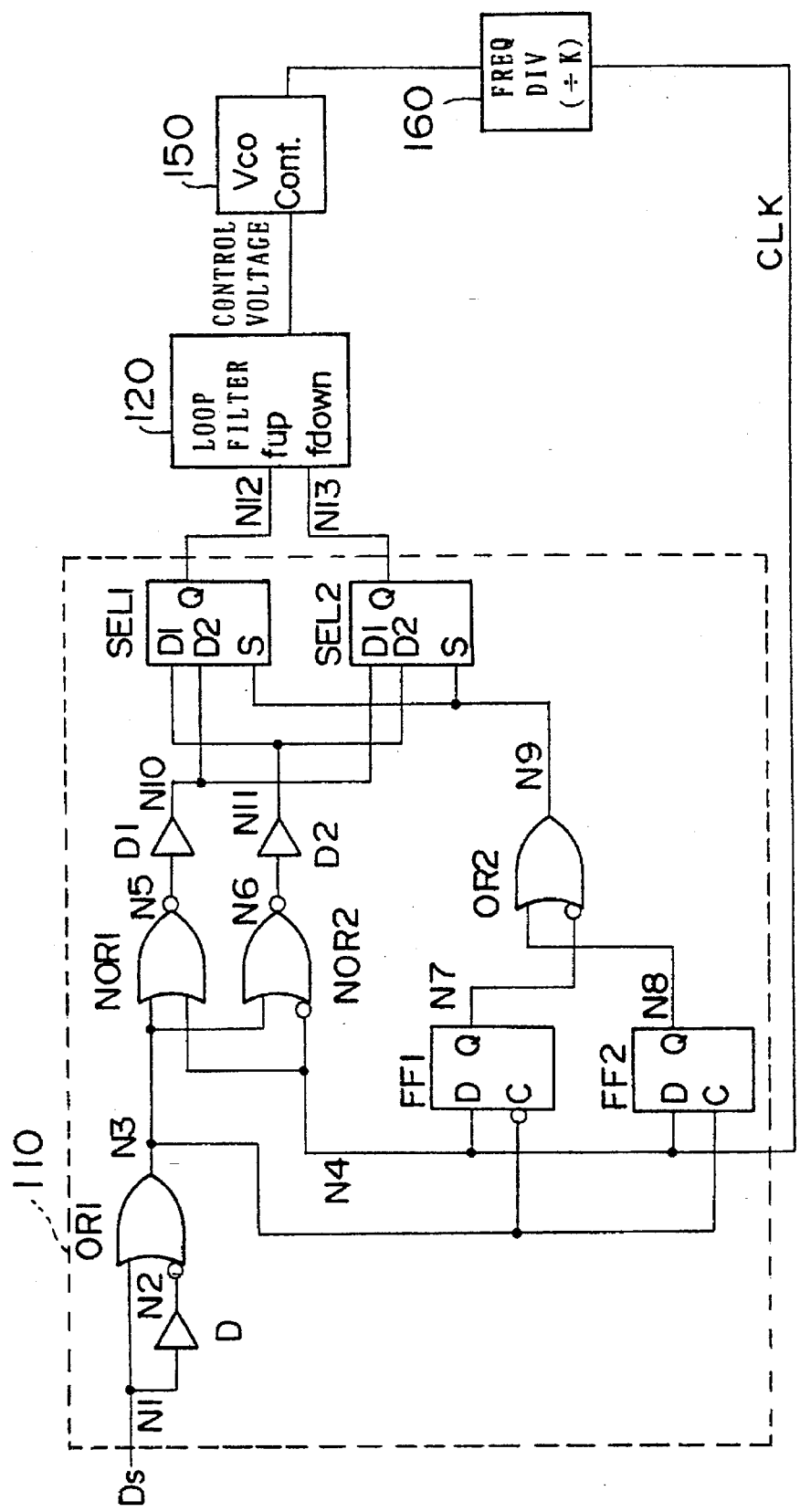
FIG. 27 is a block diagram of a PLL circuit including a phase comparator to which the first through third embodiments of the present invention can be applied.

FIG. 27 is a block diagram of a configuration in which the circuit configuration of the phase comparator 110 applicable to the first PLL circuit 100 is used as a phase comparator of a PLL circuit having a voltage controlled oscillator (VCO) 150 and a frequency divider 160 (1/k: where k is an integer). By substituting the VCO 150 and the frequency divider 160 shown in FIG. 27 for the aforementioned oscillator 130, the first PLL circuit 100 is configured. In order to facilitate understanding the structure and operation of the phase comparator 110, a description will now be given as compared with the PLL circuit which has been described with reference to FIGS. 2 and 4.

Figure 4:
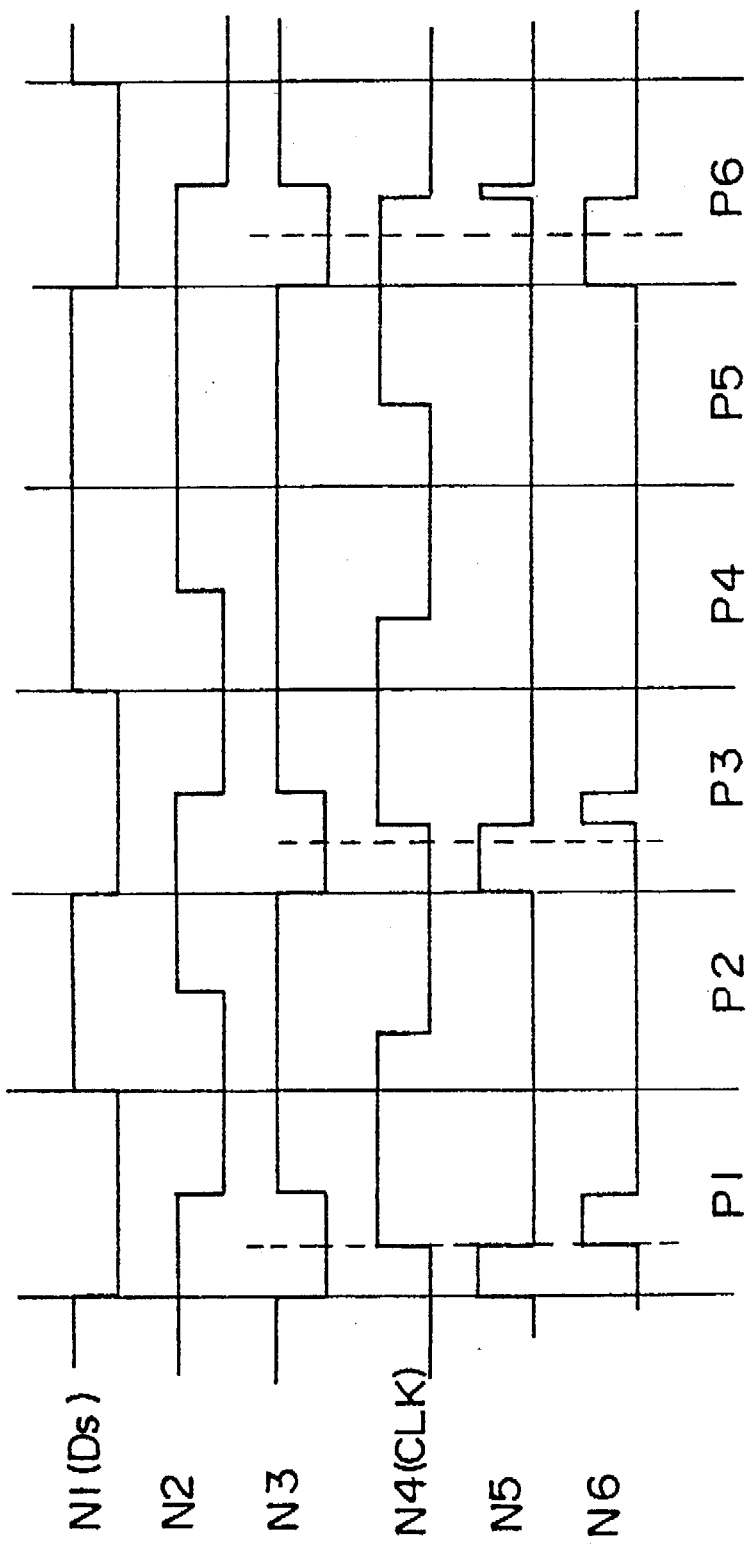
FIG. 4 is a timing chart of a defective operation of the circuit shown in FIG. 2.

The phase comparator 110 has, in addition to the configuration shown in FIG. 6, D-type flip-flops FF1 and FF2, an OR circuit OR2, selectors SEL1 and SEL2, and delay circuits D1 and D2. The flip-flops FF1 and FF2 and the OR circuit OR2 detect whether or not the rising edge of the clock signal CLK (having the same frequency as that of the input data signal) from the frequency divider 160 within the compare window N3, and controls the selectors SEL1 and SEL2 on the basis of the detection result. The selectors SEL1 and SEL2 output an $f_{up}$ signal N5 output from the NOR circuit NOR1 via the delay circuit D1 and an $f_{down}$ signal N6 output from the NOR circuit NOR2 via the delay circuit D2 to either an $f_{up}$ terminal or an $f_{down}$ terminal of the loop filter 120. For example, in the cycle P6 shown in FIG. 4 (in which the falling edge of the clock signal is present within the compare window N3), the $f_{up}$ signal N5 is not output to the $f_{up}$ terminal of the loop filter 120 but is output to the $f_{down}$ terminal thereof via the selector SEL2. Similarly, the $f_{down}$ signal N6 in the cycle P6 shown in FIG. 4 is not output to the $f_{down}$ terminal of the loop filter 120, but is output to the $f_{up}$ terminal thereof via the selector SEL1. The delay circuits D1 and D2 are used to perform a timing adjustment intended to maintain the relationship between the $f_{up}$ signal and the $f_{down}$ signal by the time when the compare window N3 is closed (the signal N3 is switched to the high level).

Figure 28:
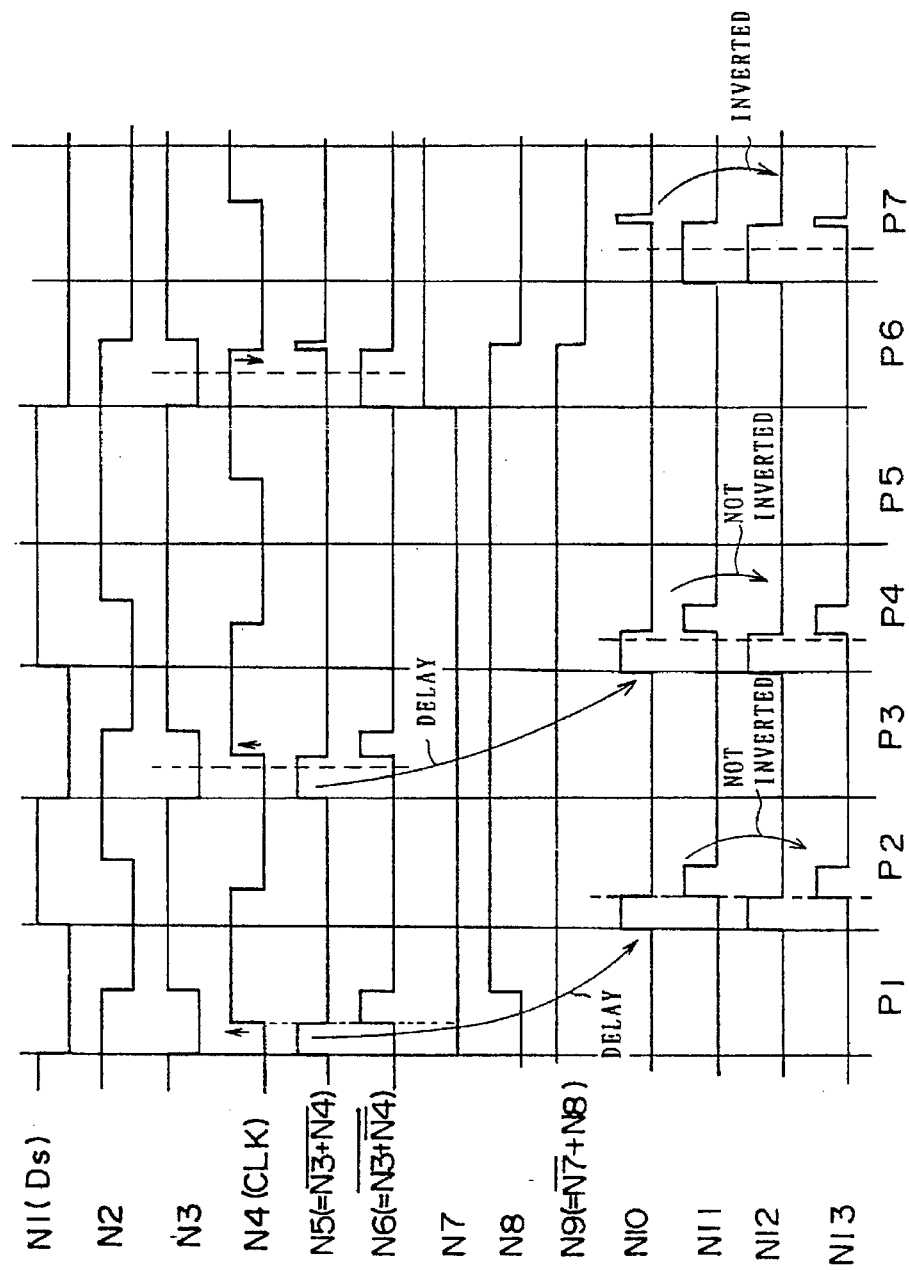
FIG. 28 is a timing chart of the operation of the PLL circuit shown in FIG. 27.

FIG. 28 is a timing chart of the operation of the PLL circuit shown in FIG. 27. The clock signal CLK (N4) has the same frequency as that of the input data signal Ds (N1). The flip-flop FF1 latches the clock signal CLK when the compare window signal N3 falls, the signal being generated each time the input data signal Ds falls. The flip-flop FF2 latches the clock signal CLK when the compare window signal N3 rises. The OR circuit OR2 outputs a high-level select signal N9 to the selectors SEL1 and SEL2 when the rising edge of the clock signal CLK is detected within the compare window (while the compare window signal N3 is low), and outputs a low-level select signal N9 thereto when the falling edge of the clock signal CLK is detected. The selectors SEL1 and SEL2 selects the terminals D1 when the terminals S are at the low level. Hence, in the cycles P2 and P4, the selectors SEL1 and SEL2 respectively output a delayed $f_{up}$ signal N10 and a delayed $f_{down}$ signal N11 to the $f_{up}$ terminal and the $f_{down}$ terminal of the loop filter 120. In the cycle P7, the selectors SEL1 and SEL2 respectively output a delayed $f_{down}$ signal N11 and a delayed $f_{up}$ signal to the $f_{up}$ terminal and the $f_{down}$ terminal of the loop filter 120.

An $f_{up}$ signal N12 and an $f_{down}$ signal N13 output by the phase comparator 110 are integrated by the loop filter 120, and the result of the integration is outputted to the VCO 150. When the integrated value of the $f_{up}$ signal N12 is greater than the integrated value of the $f_{down}$ signal N13, the VCO 150 is controlled so as to oscillate at a higher frequency. When the integrated value of the $f_{up}$ signal N12 is less than the integrated value of the $f_{down}$ signal N13, the VCO 150 is controlled so as to oscillate at a lower frequency. In the example shown in FIG. 28, the sum of the pulse widths of the $f_{up}$ signal N12 is greater than that of the pulse widths of the $f_{down}$ signal N13. Hence, the loop filter 120 generates the control voltage which increases the oscillation frequency of the VCO 150. Hence, the oscillation frequency of the VCO 150 becomes higher, and the PLL circuit is locked when the sum of the pulse widths of the $f_{up}$ signal N12 becomes equal to the sum of the pulse widths of the $f_{down}$ signal N13. That is, the PLL circuit is locked when the phase of the rising edge of the clock signal CLK coincides with the center of the compare window N3. As described above, the PLL circuit being considered is capable of generating the clock signal CLK synchronized with the input data signal from this input data signal.

In the configurations shown in FIGS. 27 and 28, the phase compare window is generated for each falling edge of the input data signal Ds. Alternatively, it is possible to generate the phase compare window for each rising edge of the input data signal Ds. The configurations used in this case will be apparent from the previous description associated with FIGS. 27 and 28 by a person having skill in the art, and a description thereof will be omitted here.

Figure 29:
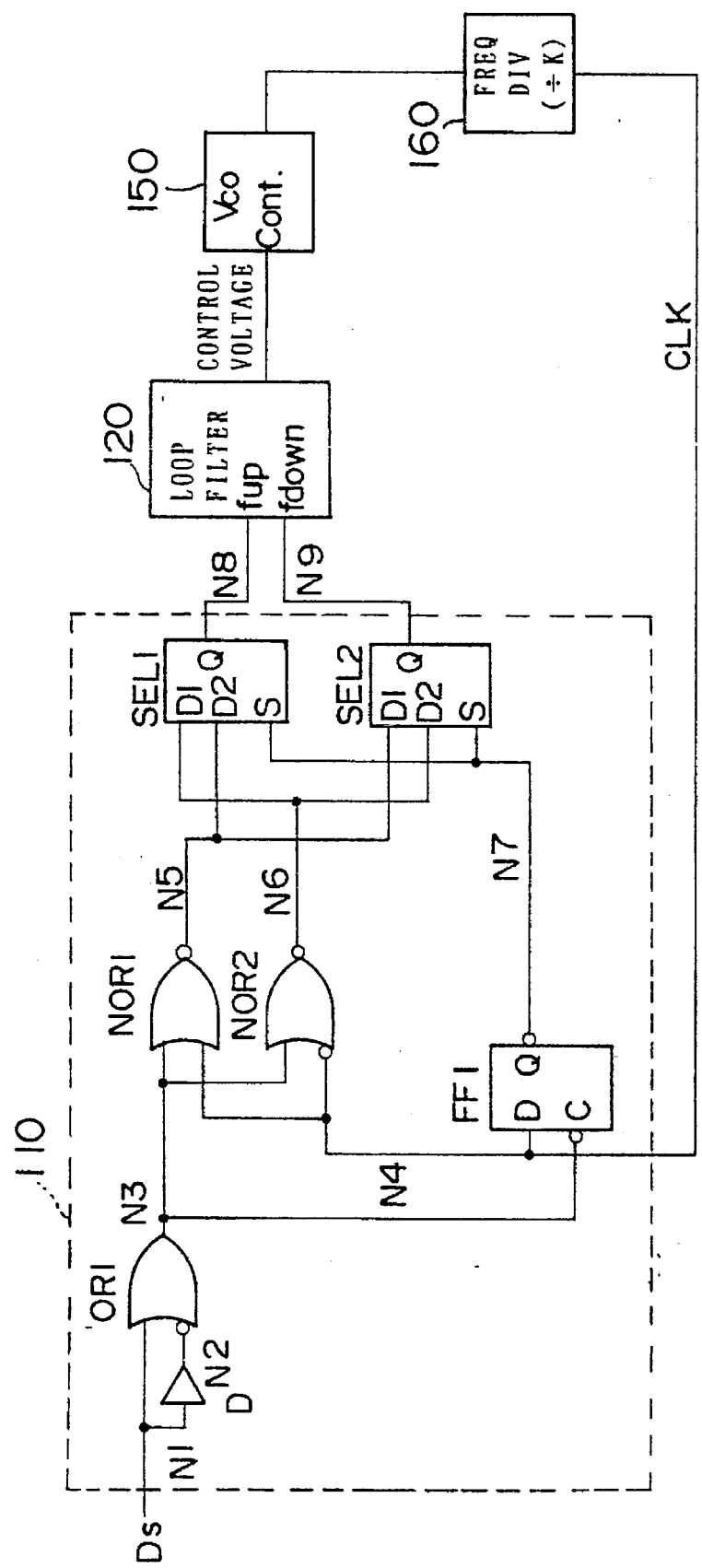
FIG. 29 is a block diagram of a PLL circuit including a phase comparator having another configuration to which the first through third embodiments of the present invention can be applied.
Figure 30:
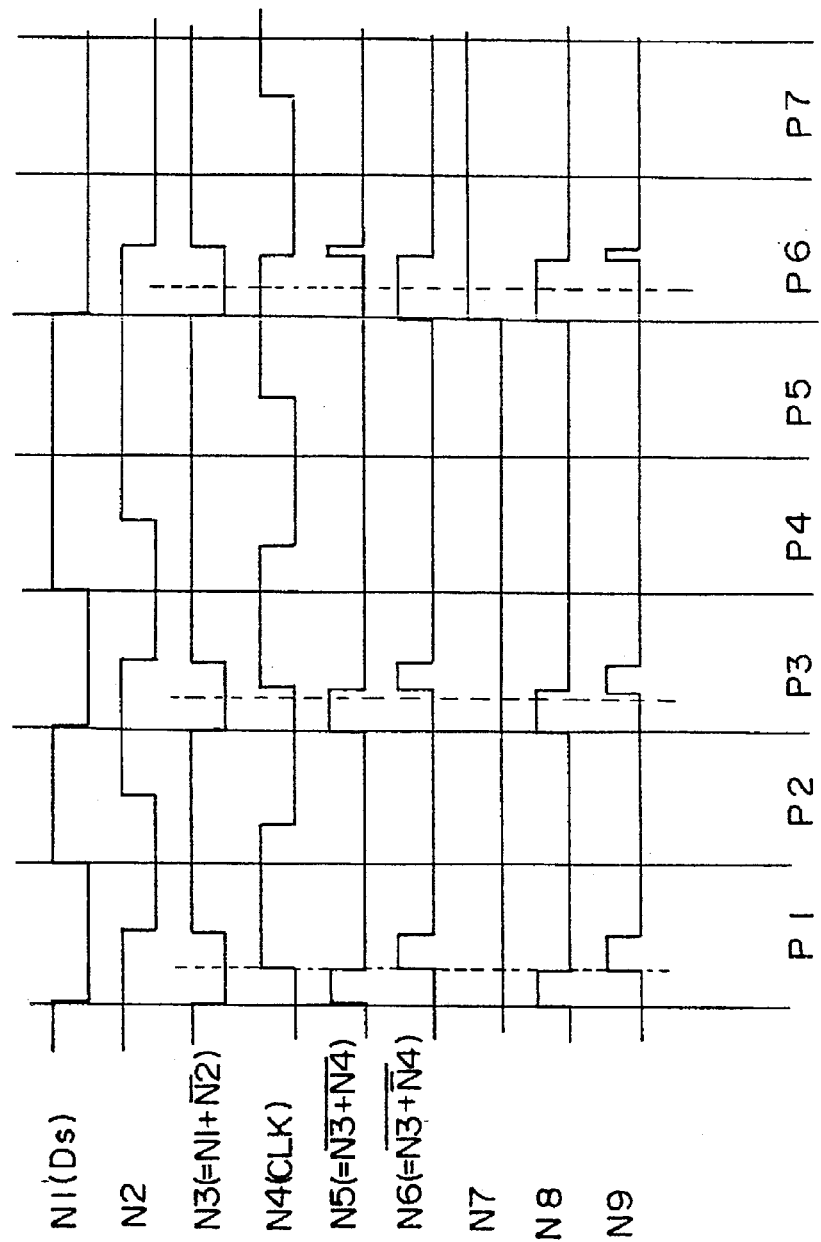
FIG. 30 is a timing chart of the operation of the PLL circuit shown in FIG. 29.

FIG. 29 is a diagram of a simplified version of the phase comparator 110 shown in FIG. 27. FIG. 30 is a timing chart of the circuit shown in FIG. 29. The configuration shown in FIG. 29 has a flip-flop FF1 and two selectors SEL1 and SEL2 in addition to the configuration shown in FIG. 2. The configuration shown in FIG. 29 differs from the configuration shown in FIG. 27 in that the selectors SEL1 and SEL2 are controlled by only the output signal (select signal) N7 of the single flip-flop FF1. When the clock signal CLK is at the high level when the compare window signal N3 falls, the next edge is absolutely the falling edge. Hence the same effects as described above can be obtained only by the single flip-flop FF1. However, a decision is not made in synchronism with the rising edge of the compare window signal N3. Hence, the configuration shown in FIG. 29 has a less precision than that of the configuration shown in FIG. 27. However, in the configuration as shown in FIG. 6, the first PLL circuit 100 is at a frequency approximately equal to that of the input data signal Ds. Hence, the configuration shown in FIG. 29 is efficient.

In the configurations shown in FIGS. 27 and 28, the phase compare window is generated for each falling edge of the input data signal Ds. Alternatively, it is possible to generate the phase compare window for each rising edge of the input data signal Ds. The configurations used in this case will be apparent from the previous description associated with FIGS. 27 and 28 by a person having skill in the art, and as such, a description thereof will be omitted here.

Figure 31:
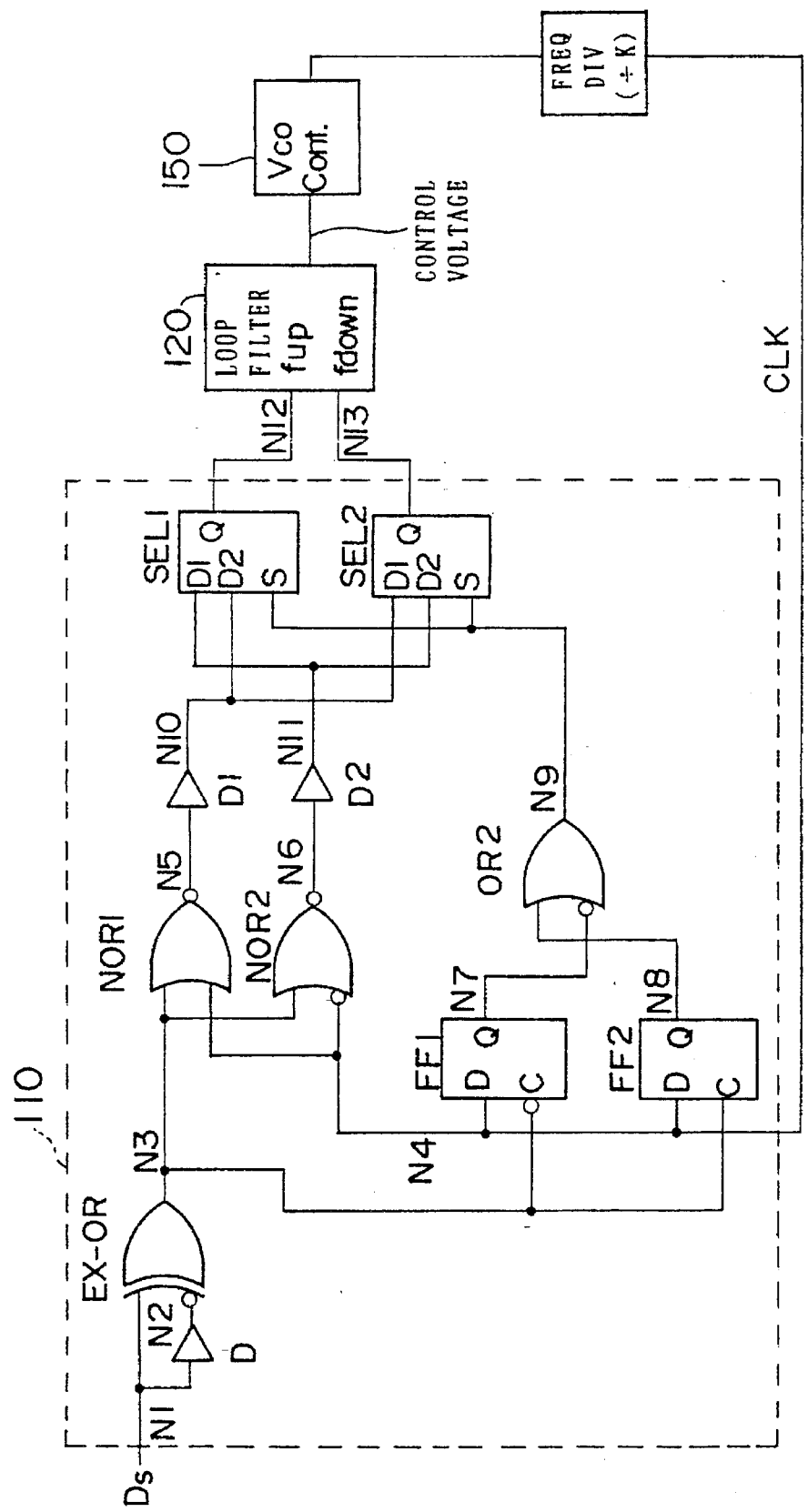
FIG. 31 is a block diagram of a PLL circuit including a phase comparator having yet another configuration to which the first through third embodiments of the present invention can be applied.
Figure 32:
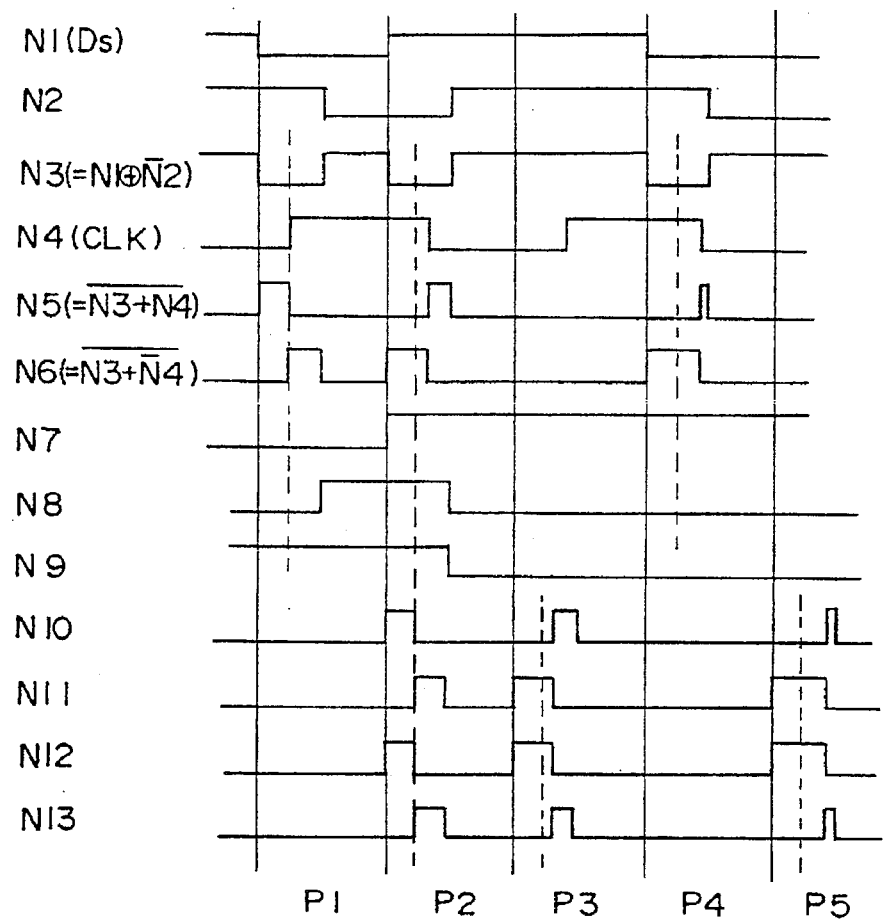
FIG. 32 is a timing chart of the operation of the PLL circuit shown in FIG. 31.

FIG. 31 shows a variation of the phase comparator 110 shown in FIG. 27, in which an exclusive-OR circuit EX-OR is substituted for the OR circuit OR1. FIG. 32 is a timing chart of the operation of the PLL circuit shown in FIG. 31. As shown in FIG. 32, the selector SEL1 outputs the delayed $f_{up}$ signal N10 to the $f_{down}$ terminal of the loop filter 120 and the selector SEL2 outputs the delayed $f_{down}$ signal N11 to the $f_{up}$ terminal thereof, when the falling edge of the clock signal CLK is detected within the phase compare window generated for each falling edge of the input data signal Ds.

Figure 33:
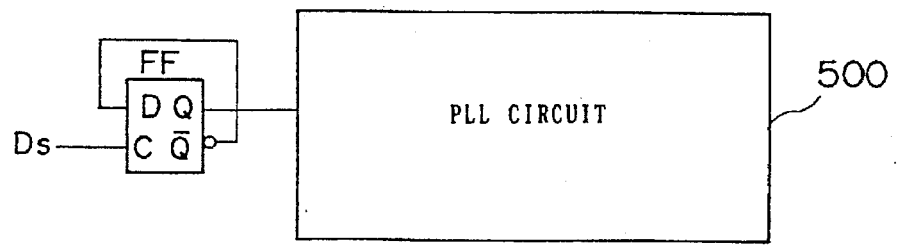
FIG. 33 is a block diagram of a first application of the PLL circuits shown in FIGS. 27, 29 and 31.

FIG. 33 is a block diagram of a first application of the PLL circuits shown in FIGS. 27, 29 and 31. A D-type flip-flop FF is provided at the front stage of a PLL circuit 500 configured as shown in FIGS. 27, 29 and 31. The use of the flip-flop FF makes it possible to reduce the frequency of the input data signal Ds applied to the PLL circuit 500 to half of the original frequency thereof. When the frequency of the input data signal Ds is extremely high, the interval between the adjacent edges of the data signal becomes narrow and a sufficient compare window may be not obtained. The configuration shown in FIG. 33 copes with such a case, and increases the edge-to-edge interval twice. Hence, a sufficient phase compare window can be obtained, and the PLL circuit can stably operate at a higher frequency.

Figure 34:
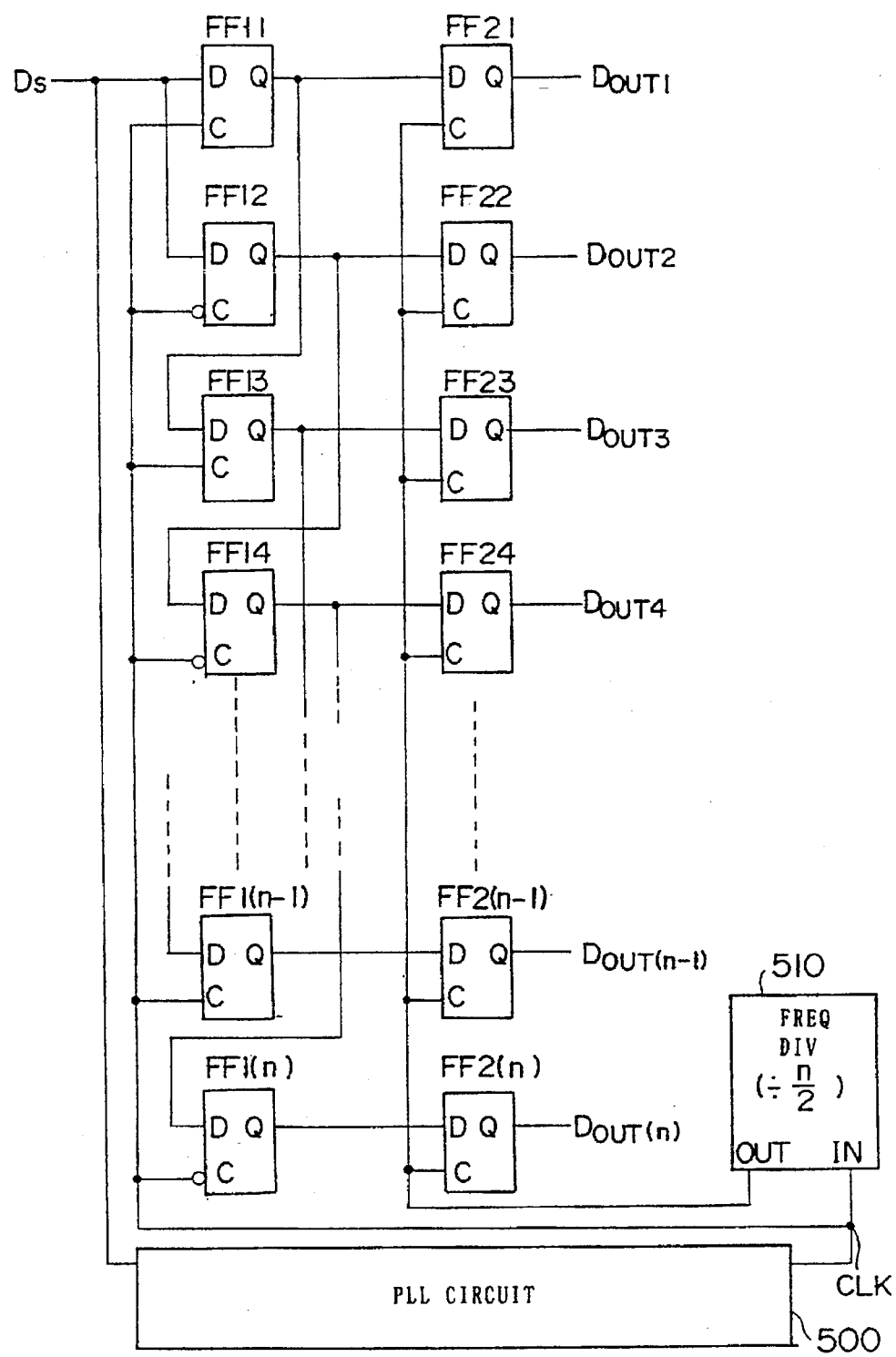
FIG. 34 is a timing chart of a second application of the PLL circuit shown in FIGS. 27, 29 and 31.

FIG. 34 is a block diagram of a second application of the PLL circuits shown in FIGS. 27, 29 and 31. The configuration shown in FIG. 34 is intended to convert the serial input data signal Ds into parallel data signals Dout(1) through Dout(n) by means of the PLL circuit 500 (a serial-to-parallel conversion circuit or a demultiplexer circuit). In FIG. 34, n D-type flip-flops FF11 through FF1(n) form a shift register (which corresponds to the shift register unit 330 shown in FIG. 24), and n D-type flip-flops FF21 through FF2(n) form a data latch (which corresponds to the data latch unit 340 shown in FIG. 24). A frequency divider 510 (which corresponds to the frequency divider 350 shown in FIG. 24) generates the clock signal having a frequency equal to 2/n times that of the clock signal CLK output by the PLL circuit 500, and outputs it to the above flip-flops. With the above structure, it is possible to perform the serial-to-parallel conversion at the same frequency as that of the input data signal Ds.

It is preferable that the configurations shown in FIGS. 33 and 34 be formed on respective single-chips.

The present invention is not limited to the specifically disclosed embodiments, and variations and modifications may be made without departing from the scope of the present invention.

What is claimed is:

1. A signal processing device, comprising:
   a first phase-locked loop (PLL) circuit, operating in synchronism with a serial input data signal, for generating a first control signal;
   a second phase-locked loop (PLL) circuit, operating in synchronism with an external reference clock signal, for generating a second control signal;
   shift register means for shifting n bits of the serial input data signal in synchronism with the first clock signal output by the first oscillator where n is an integer;
   a frequency divider which outputs a third clock signal by frequency-dividing the first clock signal; and
   latch means for latching the n bits of the serial input data signal output by the shift register means in synchronism with the third clock signal and for outputting the n bits in parallel,
   wherein said second control signal generated by said second PLL circuit controls an oscillation frequency of said second PLL circuit and is also capable of controlling an oscillation frequency of the first PLL circuit such that said first PLL circuit is capable of operating, in a stable manner, by said oscillation frequency of said second PLL circuit even in the absence of said serial input data signal, wherein the first PLL circuit comprises first means for comparing a phase of the serial input data signal with a phase of a first clock signal and generating the first control signal dependent on a result of a first phase comparison, and a first oscillator oscillating on the basis of the first control signal and the second control signal in synchronism with the serial input data signal, the first clock signal being oscillated by the first oscillator, and wherein the second PLL circuit comprises second means for comparing a phase of the external reference clock signal with a phase of a second clock signal and for generating the second control signal dependent on a result of a second phase comparison, and a second oscillator oscillating on the basis of the second control signal in synchronism with the external reference clock signal, the second clock signal being oscillated by the second oscillator.

2. A signal processing device, comprising:

a first phase-locked loop (PLL) circuit, operating in synchronism with a serial input data signal, for generating a first control signal; and a second phase-locked loop (PLL) circuit, operating in synchronism with an external reference clock signal, for generating a second control signal, wherein said second control signal generated by said second PLL circuit controls an oscillation frequency of said second PLL circuit and is also capable of controlling an oscillation frequency of the first PLL circuit such that said first PLL circuit is capable of operating, in a stable manner, by said oscillation frequency of said second PLL circuit even in the absence of said serial input data signal, wherein the first PLL circuit comprises:

phase comparing means for comparing a phase of the serial input data signal with a phase of a clock signal and generating a leading pulse signal and a lagging pulse signal dependent on a phase difference indicated by a result of a phase comparison, loop filter means for integrating the leading pulse signal and the lagging pulse signal and for generating a control signal, and oscillator means for generating the clock signal which has a frequency identical to that of the serial input data signal and is varied in accordance with the control signal, and wherein said phase comparing means comprises:

first gate means for generating a phase compare window signal for each rising or falling edge of the serial input data, signal;

second gate means for generating the leading pulse signal and the lagging pulse signal on the basis of the phase compare window signal and the clock signal; and detection/selection means for detecting an edge of the clock signal within phase compare window indicated by said phase compare window signal, outputting the leading pulse signal and the lagging pulse signal to the loop filter means without any modification when a first predetermined one of the rising edge and falling edge of the clock signal is detected, and for outputting the leading pulse signal and the lagging pulse signal to the loop filter means when a second predetermined one of the rising edge and falling edge of the clock signal is detected.

3. The signal processing device as claimed in either claim 1 or claim 2, wherein:

the first PLL circuit comprises a first oscillator; and the second PLL circuit comprises a second oscillator having a structure substantially identical to that of the first oscillator.

4. The signal processing device as claimed in claim 2, wherein:

the first PLL circuit comprises first means for comparing a phase of the serial input data signal with a phase of a first clock signal and generating the first control signal dependent on a result of a first phase comparison, and a first oscillator oscillating on the basis of the first control signal and the second control signal in synchronism with the serial input data signal, the first clock signal being oscillated by the first oscillator; and the second PLL circuit comprises second means for comparing a phase of the external reference clock signal with a phase of a second clock signal and for generating the second control signal dependent on a result of a second phase comparison, and a second oscillator oscillating on the basis of the second control signal in synchronism with the external reference clock signal, the second clock signal being oscillated by the second oscillator.

5. The signal processing device as claimed in claim 4, wherein:

the second control signal controls a first parameter which varies an oscillation frequency of the second oscillator;

the second control signal also controls a parameter identical to the first parameter and used to vary an oscillation frequency of the first oscillator; and the first control signal controls a second parameter which varies the oscillation frequency of the first oscillator and is different from the first parameter.

6. The signal processing device as claimed in claim 4, wherein:

the first PLL circuit comprises a first non-stable multivibrator; and the second PLL circuit comprises a second non-stable multivibrator having a structure substantially identical to that of the first non-stable multivibrator.

7. The signal processing device as claimed in claim 4, wherein:

the first PLL circuit comprises a first ring oscillator; and the second PLL circuit comprises a second ring oscillator having a structure substantially identical to that of the first ring oscillator.

8. The signal processing device as claimed in claim 4, wherein a frequency of the first clock signal is equal to 1/n times a frequency of the serial input data signal where n is an integer equal to or greater than 1.

9. The signal processing device as claimed in claim 4, wherein the first oscillator and the second oscillator oscillate at an identical frequency in response to the second control signal.

10. The signal processing device as claimed in either claim 1 or claim 2, wherein the external reference clock signal has a frequency lower than that of the serial input data signal.

11. The signal processing device as claimed in claim 4, wherein the external reference clock signal has a frequency lower than that of the serial input data signal.

12. The signal processing device as claimed in claim 1, wherein a second frequency range which can be varied by the second control signal is greater than a first frequency range which can be varied by the first control signal.

13. The signal processing device as claimed in claim 4, wherein the second PLL circuit has a loop gain greater than that of the first PLL circuit.

14. The signal processing device as claimed in either claim 1 or claim 2, wherein:
the first PLL circuit is connected to a first power supply system; and
the second PLL circuit is connected to a second power supply system different from the first power supply system.

15. The signal processing device as claimed in claim 4, wherein:
the first PLL circuit is connected to a first power supply system; and
the second PLL circuit is connected to a second power supply system different from the first power supply system.

16. The signal processing device as claimed in claim 5, wherein:
the first PLL circuit is connected to a first power supply line and a first ground line;
the second PLL circuit is connected to a second power supply line and a second ground line; and
the first parameter of the first oscillator controlled by the second control signal is a current flowing in the first oscillator from the first power supply line to the first ground line.

17. The signal processing device as claimed in claim 4, further comprising latch means for latching the serial input data signal in response to the first clock signal output by the first oscillator and for outputting the serial input data signal in synchronism with the first clock signal.

18. The signal processing device as claimed in claim 1, wherein the first clock signal has a frequency equal to or lower than that of the serial input data signal.

19. The signal processing device as claimed in either claim 1 or claim 2, further comprising a chip on which the first PLL circuit and the second PLL circuit are formed.

20. The signal processing device as claimed in claim 4, further comprising a chip on which the first PLL circuit and the second PLL circuit are formed.

21. The signal processing device as claimed in claim 11, further comprising:
a first isolation area which encloses the first PLL circuit; and
a second isolation area which encloses the second PLL circuit.

22. A signal processing device comprising:
phase comparing means for comparing a phase of a serial input data signal with a phase of a clock signal and generating a leading pulse signal and a lagging pulse signal dependent on a phase difference indicated by a result of a phase comparison;
loop filter means for integrating the leading pulse signal and the lagging pulse signal and for generating a control signal; and
oscillator means for generating the clock signal which has a frequency identical to that of the serial input data signal and is varied in accordance with the control signal, and
wherein said phase comparing means comprises:
first gate means for generating a phase compare window signal for each rising or falling edge of the serial input data signal;
second gate means for generating the leading pulse signal and the lagging pulse signal on the basis of the phase compare window signal and the clock signal; and
detection/selection means for detecting an edge of the clock signal within phase compare window indicated by said phase compare window signal, outputting the leading pulse signal and the lagging pulse signal to the loop filter means without any modification when a first predetermined one of the rising edge and falling edge of the clock signal is detected, and for outputting the leading pulse signal and the lagging pulse signal to the loop filter means when a second predetermined one of the rising edge and falling edge of the clock signal is detected.

23. The signal processing device as claimed in claim 22, wherein the detection/selection means comprises:
third gate means for the edge of the clock signal within phase compare window indicated by said phase compare window signal and for generating a select signal having a first level when the first predetermined one of the rising edge and falling edge of the clock signal is detected and a second level when the second predetermined one of the rising edge and falling edge of the clock signal is detected;
a first selector receiving the leading pulse signal and the lagging pulse signal, outputting the leading pulse signal to the loop filter means when the select signal is at the first level and for outputting the lagging pulse signal thereto as a leading pulse signal when the select signal is at the second level; and
a second selector receiving the leading pulse signal and the lagging pulse signal, outputting the lagging pulse signal to the loop filter means when the select signal is at the first level and for outputting the leading pulse signal thereto as a lagging pulse signal when the select signal is at the second level.

24. The signal processing device as claimed in claim 22, further comprising means, provided in a front stage of the phase comparing means, for reducing a frequency of the serial input data signal.

25. The signal processing device as claimed in claim 23, further comprising means, provided in a front stage of the phase comparing means, for reducing a frequency of the serial input data signal.

26. The signal processing device as claimed in claim 22, further comprising:
shift register means for shifting n bits of the serial input data signal in synchronism with the clock signal output by the oscillator means;
a frequency divider generating another clock signal by frequency-dividing said clock signal; and
latch means for converting the n bits of the serial input data signal output by the shift register means in synchronism with said another clock signal and for outputting the n bits in parallel.

27. The signal processing device as claimed in claim 23, further comprising:

shift register means for shifting n bits of the serial input data signal in synchronism with the clock signal output by the oscillator means;

a frequency divider generating another clock signal by frequency-dividing said clock signal; and latch means for converting the n bits of the serial input data signal output by the shift register means in synchronism with said another clock signal and for outputting the n bits in parallel.

28. The signal processing device as claimed in claim 24, further comprising:

shift register means for shifting n bits of the serial input data signal in synchronism with the clock signal output by the oscillator means;

a frequency divider generating another clock signal by frequency-dividing said clock signal; and latch means for converting the n bits of the serial input data signal output by the shift register means in synchronism with said another clock signal and for outputting the n bits in parallel.

29. The signal processing device as claimed in claim 25, further comprising:

shift register means for shifting n bits of the serial input data signal in synchronism with the clock signal output by the oscillator means;

a frequency divider generating another clock signal by frequency-dividing said clock signal; and latch means for converting the n bits of the serial input data signal output by the shift register means in synchronism with said another clock signal and for outputting the n bits in parallel.

* * * * *